United States Patent
Jung et al.

(10) Patent No.: US 12,133,424 B2
(45) Date of Patent: Oct. 29, 2024

(54) DISPLAY DEVICE AND METHOD OF MANUFACTURING THE DISPLAY DEVICE

(71) Applicant: Samsung Display Co., LTD., Yongin-si (KR)

(72) Inventors: Kyu Ho Jung, Osan-si (KR); Suk Won Jung, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 19 days.

(21) Appl. No.: 17/214,536

(22) Filed: Mar. 26, 2021

(65) Prior Publication Data

US 2021/0399070 A1 Dec. 23, 2021

(30) Foreign Application Priority Data

Jun. 17, 2020 (KR) .......................... 10-2020-0073628

(51) Int. Cl.
*H10K 59/124* (2023.01)
*H10K 50/844* (2023.01)
*H10K 71/00* (2023.01)

(52) U.S. Cl.
CPC ......... *H10K 59/124* (2023.02); *H10K 50/844* (2023.02); *H10K 71/00* (2023.02)

(58) Field of Classification Search
CPC ... H01L 51/5253–5256; H01L 27/3223; H01L 27/3258; H01L 27/1214; H01L 27/323; H01L 27/3276; H01L 51/0097; H01L 51/5237; H01L 51/524; H01L 51/56; G02F 1/1333
See application file for complete search history.

(56) References Cited

U.S. PATENT DOCUMENTS

| | | |
|---|---|---|
| 10,510,816 B2 | 12/2019 | Kim et al. |
| 10,903,289 B2 | 1/2021 | Kim et al. |
| 10,916,608 B2 | 2/2021 | Kim |
| 11,004,912 B2 | 5/2021 | Kim et al. |
| 11,711,962 B2 | 7/2023 | Kim et al. |
| 2016/0141552 A1* | 5/2016 | Chen ...................... H01L 51/56 438/23 |

(Continued)

FOREIGN PATENT DOCUMENTS

| | | |
|---|---|---|
| EP | 4148785 A1 | 3/2023 |
| KR | 1020080040483 | 5/2008 |

(Continued)

OTHER PUBLICATIONS

Extended European Search Report—European Application No. 21178119.0 dated Nov. 12, 2021.

(Continued)

*Primary Examiner* — Shaun M Campbell
(74) *Attorney, Agent, or Firm* — CANTOR COLBURN LLP

(57) ABSTRACT

A display device includes a substrate including a front member, first and second side members extended from the front member, and a first corner disposed between the first and second side members, the first side member being bent along a first bending line in a first direction, the second side member being bent along a second bending line in a second direction crossing the first direction, and an alignment mark disposed at the first corner of the substrate.

18 Claims, 19 Drawing Sheets

(56) References Cited

U.S. PATENT DOCUMENTS

| | | | |
|---|---|---|---|
| 2016/0270209 A1* | 9/2016 | Cho | G06F 1/1652 |
| 2017/0150617 A1* | 5/2017 | Jeong | G09G 3/3225 |
| 2018/0151845 A1* | 5/2018 | Jeong | H01L 51/5281 |
| 2020/0067017 A1* | 2/2020 | Seo | H01L 51/5256 |
| 2020/0119111 A1 | 4/2020 | Kim et al. | |
| 2020/0168675 A1* | 5/2020 | Kim | H01L 27/3276 |
| 2022/0045140 A1* | 2/2022 | Bai | H01L 27/12 |

FOREIGN PATENT DOCUMENTS

| | | |
|---|---|---|
| KR | 1020090031825 | 3/2009 |
| KR | 1020100108756 | 10/2010 |
| KR | 1020140120845 | 10/2014 |
| KR | 1020150055643 A | 5/2015 |
| KR | 1020180127606 A | 11/2018 |
| KR | 1020190066646 | 6/2019 |
| KR | 1020190086061 A | 7/2019 |
| KR | 1020200064217 A | 6/2020 |

OTHER PUBLICATIONS

European Office Action—European Application No. 21178119.0 dated Apr. 30, 2024.

\* cited by examiner

DISPLAY DEVICE AND METHOD OF MANUFACTURING THE DISPLAY DEVICE

This application claims priority to Korean Patent Application No. 10-2020-0073628, filed on Jun. 17, 2020, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

An importance of display devices has steadily increased with a development of multimedia technology. Accordingly, various types of display devices such as a liquid crystal display ("LCD"), an organic light emitting display ("OLED") and the like are being used.

A display device may include a display panel for displaying an image and a window bonded with the display panel. When being bonded with each other, the display panel and the window may be aligned with alignment marks marked thereon.

First, a vision camera may perceive the alignment marks marked on the display panel and the window and locate the display panel and the window based on the positions and shapes of the perceived alignment marks. Next, one of the display panel and the window may be moved on to the other, and the display panel and the window may be bonded with each other.

With diversification of electronic devices employing display devices, it is desired for the display devices to be provided in various designs. A display device capable of displaying an image on its side surfaces extending from its front surface as well as the front surface is being researched, for example.

SUMMARY

Features of the invention provide a display device capable of facilitating perception of alignment marks and a method of manufacturing the display device.

Features of the invention also provide a display device capable of minimizing distortions of alignment marks and a method of manufacturing the display device.

However, features of the invention are not restricted to those set forth herein. The above and other features of the invention will become more apparent to one of ordinary skill in the art to which the invention pertains by referencing the detailed description of the invention given below.

An embodiment of a display device includes a substrate including a front member, first and second side members extended from the front member, and a first corner disposed between the first and second side members, the first side member being bent along a first bending line in a first direction, the second side member being bent along a second bending line in a second direction crossing the first direction, and an alignment mark disposed at the first corner of the substrate.

An embodiment of a display device includes a substrate including corners having a curvature, the substrate being bent along a first bending line in a first direction and a second bending line in a second direction crossing the first direction, and alignment marks disposed at corners of the substrate.

An embodiment of a method of manufacturing a display device includes preparing a cover window and a display panel, bending the display panel to form a front member, a first side member bent along a first bending line in a first direction, and a second side member bent along a second bending line in a second direction crossing the first direction, perceiving an alignment mark of the display panel, which is disposed at a first corner between the first and second side members, determining whether the cover window and the display panel are aligned, and bonding the cover window to the display panel.

A display device and a method of manufacturing the display device in various embodiments are capable of facilitating perception of alignment marks.

A display device and a method of manufacturing the display device in various embodiments are also capable of minimizing distortions of alignment marks.

The effects of the invention are not limited to the aforementioned effects, and various other effects are included in the specification.

BRIEF DESCRIPTION OF THE DRAWINGS

The above and other embodiments, advantages and features of the invention will become more apparent by describing in detail embodiments thereof with reference to the attached drawings, in which.

DETAILED DESCRIPTION

Figure 1:
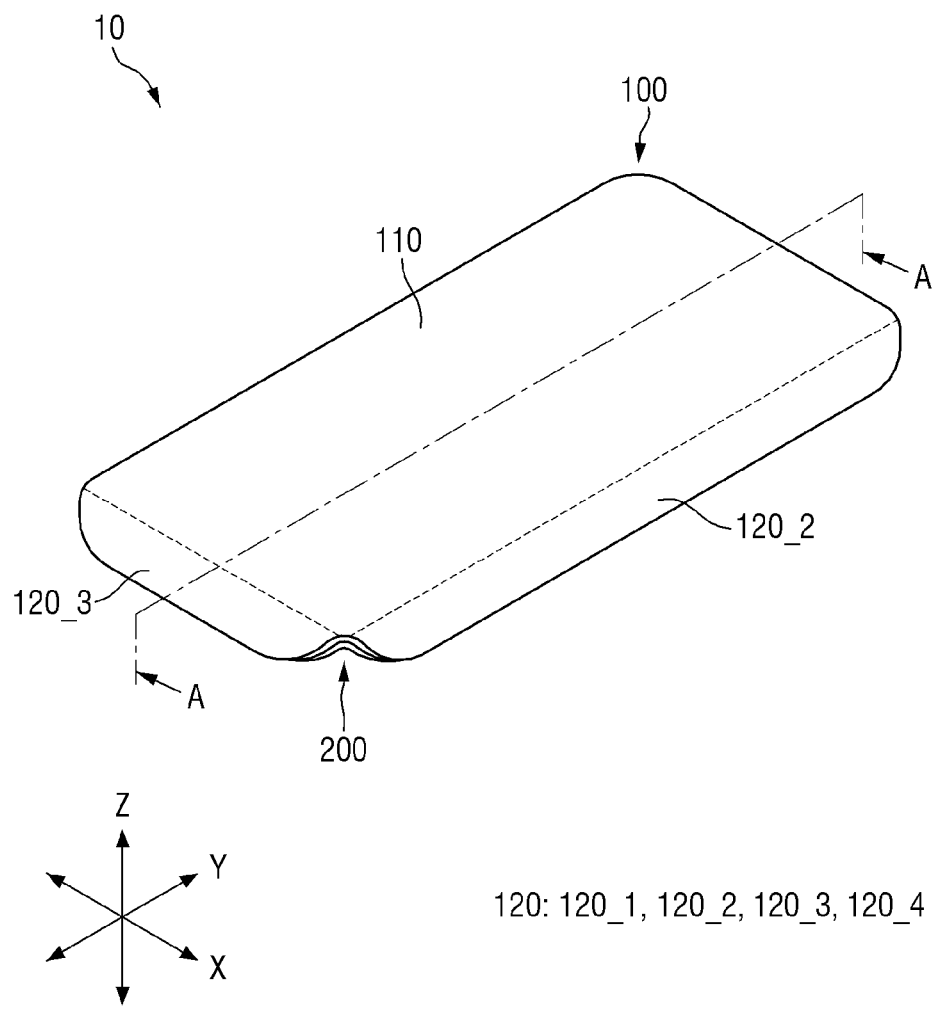
FIG. 1 is a perspective view showing an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described in detail with reference to the accompanying drawings.

Figure 2:
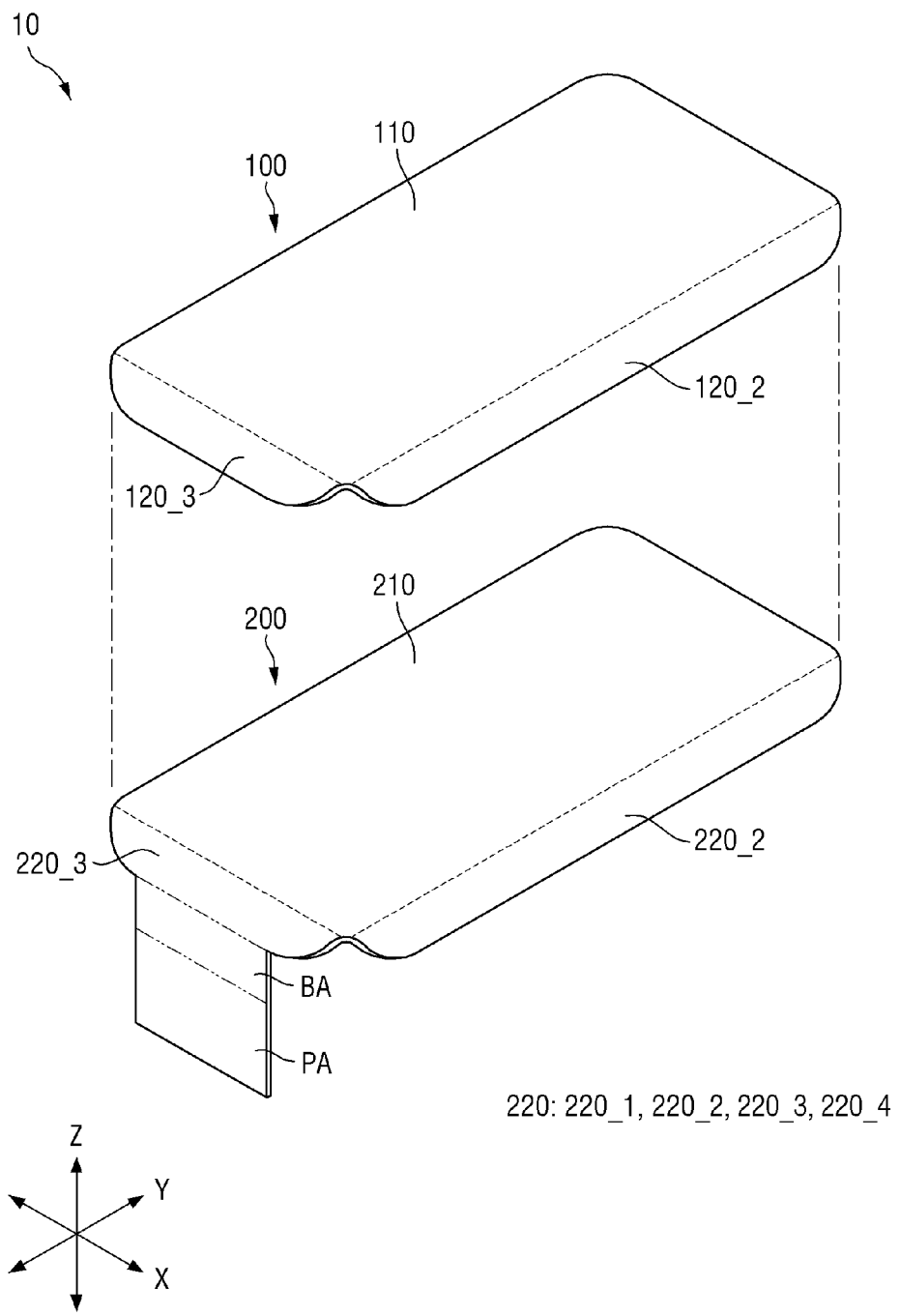
FIG. 2 is an exploded perspective view of the display device of FIG. 1.
Figure 3:
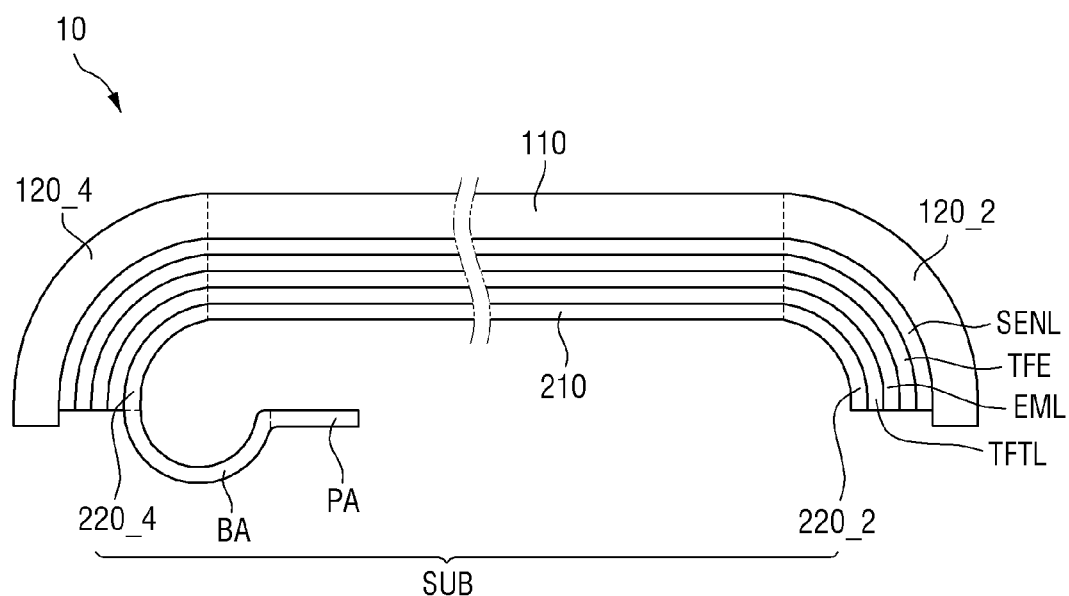
FIG. 3 is a cross-sectional view taken along line A-A of FIG. 1.
Figure 4:
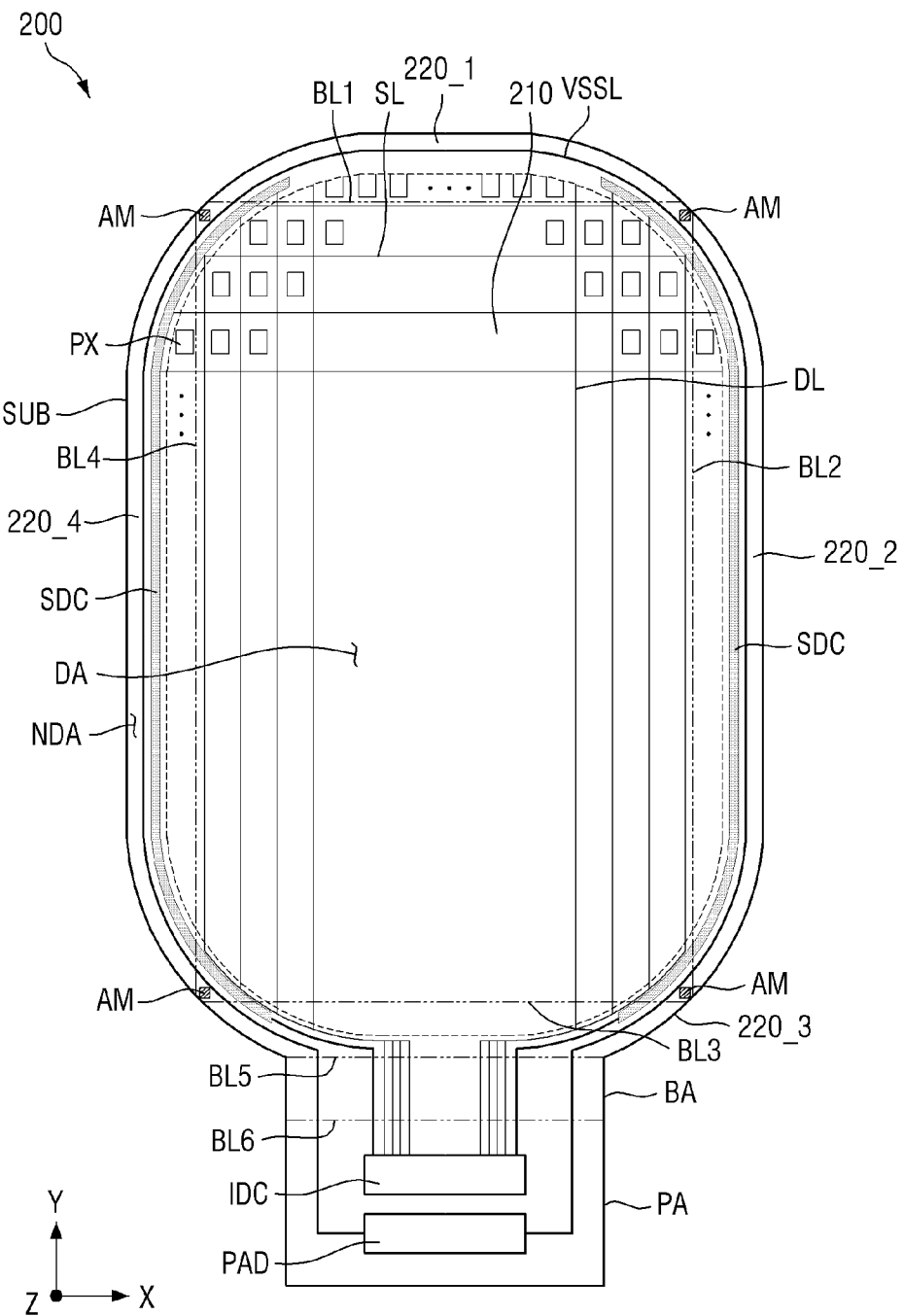
FIG. 4 is a plan view of a display panel of FIG. 1 in an unfolded state.
Figure 5:
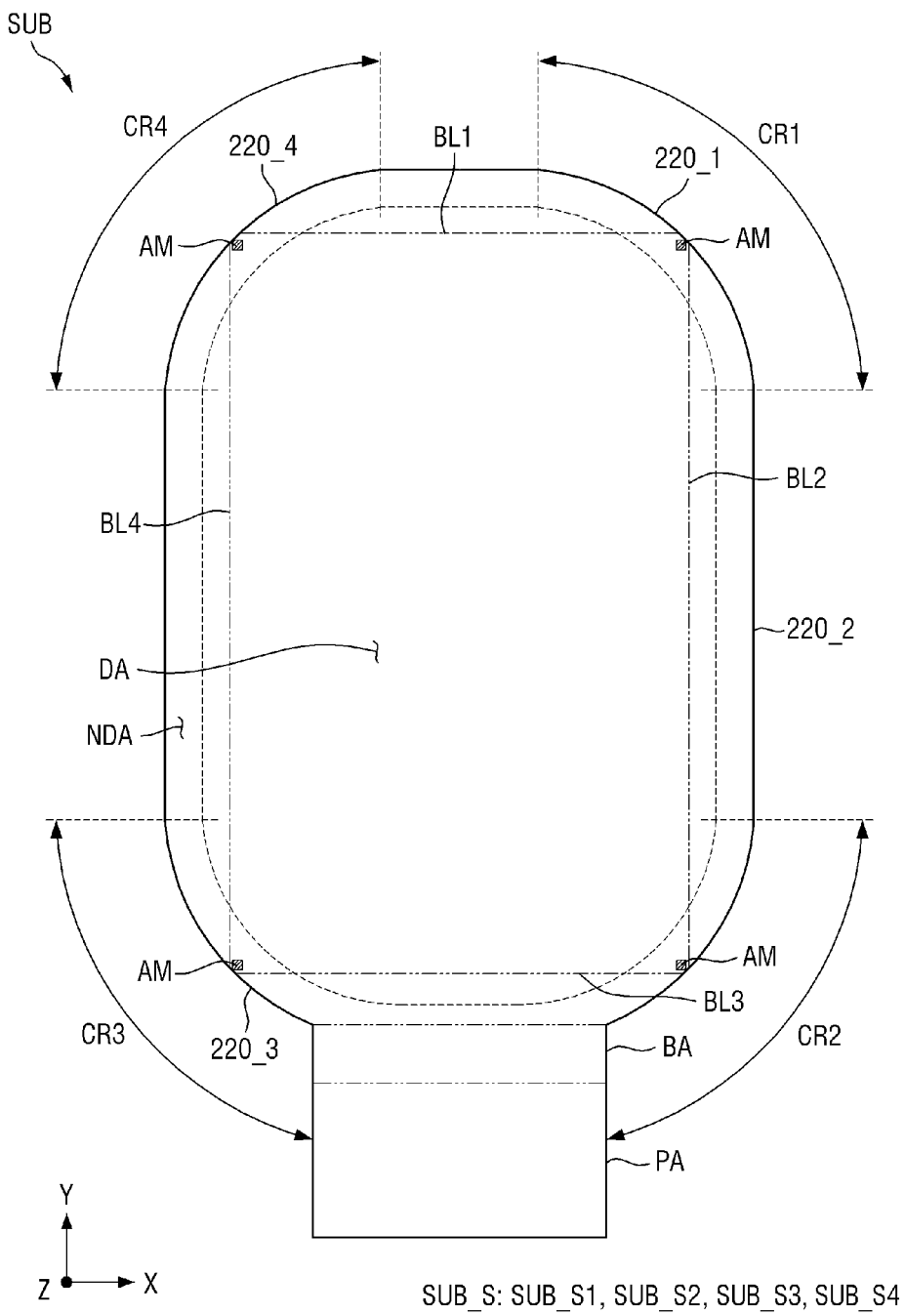
FIG. 5 is a plan view of a substrate of a display panel of FIG. 3.

FIG. 1 is a perspective view showing an embodiment of a display device. FIG. 2 is an exploded perspective view of the display device of FIG. 1. FIG. 3 is a cross-sectional view taken along line A-A of FIG. 1. FIG. 4 is a plan view of a display panel of FIG. 1 in an unfolded state. FIG. 5 is a plan view of a substrate of a display panel of FIG. 3.

A display device 10 in an embodiment may be applied to portable electronic devices such as a mobile phone, a smartphone, a tablet personal computer ("PC"), a mobile communication terminal, an electronic organizer, an electronic book, a portable multimedia player ("PMP"), a navigation system, an ultra mobile PC ("UMPC") or the like. In an alternative embodiment, the display device 10 may be applied as a display unit of a television, a laptop, a monitor, a billboard, or an Internet-of-Things ("IoT") terminal. In an alternative embodiment, the display device 10 in an embodiment may be applied to wearable devices such as a smart watch, a watch phone, a glasses type display, or a head mounted display ("HMD"). In an alternative embodiment, the display device 10 in an embodiment may be applied to a dashboard of a vehicle, a center fascia of a vehicle, a center information display ("CID") disposed on a dashboard of a vehicle, a room mirror display in place of side mirrors of a vehicle, or a display disposed on a rear surface of a front seat for rear seat entertainment of a vehicle.

In the invention, the first direction X may be a horizontal direction. The second direction Y may be a vertical direction. The third direction Z may be a thickness direction. Furthermore, the third direction Z toward the top of FIG. 1 may be referred to as upward direction, and the third direction Z toward the bottom of FIG. 1 may be referred to as downward direction. In this regard, a surface of a member that faces the upward direction may be referred to as top surface, and a surface opposite to the top surface may be referred to as bottom surface. However, the directions refer to exemplary and relative directions and are not limited to the aforementioned examples.

With reference to FIGS. 1 and 5, the display device 10 in an embodiment may include a cover window 100 and a display panel 200.

The cover window 100 covers the display panel 200 to be described later. The cover window 100 may protect the display panel 200.

The cover window 100 may include a front member 110 and side members 120.

The front member 110 of the cover window 100 may have a quadrangular (e.g., rectangular) shape with short sides in the first direction X and long sides in the second direction Y, but the invention is not limited thereto. The front member 110 of the cover window 100 may also have a shape of a different polygon, a circle, or an ellipse in a plan view. The front member 110 of the cover window 100 may have corners each having a curvature (convex outward) in a plan view. In some embodiments, the corners of the front member 110 may be bent in the thickness direction.

The side members 120 of the cover window 100 are arranged along the edges of the front member 110 of the cover window 100. In an embodiment, the side members 120 of the cover window 100 may surround an entirety of the edges of the front member 110 of the cover window 100. In some embodiments, the side members 120 of the cover window 100 may cover portions of the edges of the front member 110 of the cover window 100.

The side members 120 of the cover window 100 extend from the edges of the cover window 100 and are bent in the thickness direction. In an embodiment, the front member 110 and the side members 120 of the cover window 100 may define an angle in a range of about 70 degrees to about 120 degrees, for example, but the invention is not limited thereto.

The side members 120 may include a first side member 120_1, a second side member 120_2, a third side member 120_3, and a fourth side member 120_4.

The first side member 120_1, the second side member 120_2, the third side member 120_3, and the fourth side member 120_4 of the cover window 100 respectively extend from a first side, a second side, a third side, and a fourth side of the front member 110 and are bent in the thickness direction. In FIGS. 1 and 2, the first side, the second side, the third side, and the fourth side may refer to an upper-right side, a lower-right side, a lower-left side, and an upper-left side, respectively.

The first side member 120_1, the second side member 120_2, the third side member 120_3, and the fourth side member 120_4 of the cover window 100 may be surround an entirety of the edges of the front member 110 of the cover window 100. The first side member 120_1, the second side member 120_2, the third side member 120_3, and the fourth side member 120_4 of the cover window 100 may have respective outmost edges forming the circumference of the cover window 100.

The first side member 120_1, the second side member 120_2, the third side member 120_3, and the fourth side member 120_4 of the cover window 100 may each have a width which becomes smaller as it approaches the corner of the front member 110 of the cover window 100. Accordingly, gaps widening downward may be defined respectively between the first and second side members 120_1 and 120_2, between the second and third side members 120_2 and 120_3, between the third and fourth side members 120_3 and 120_4, and between the fourth and first side members 120_4 and 120_1. The edges of the first side member 120_1, the second side member 120_2, the third side member 120_3, and the fourth side member 120_4 of the cover window 100 may meet at the respective corners of the front member 110 of the cover window 100.

The cover window 100 may include a transparent insulating material such as glass or plastic. The cover window 100 may have flexibility. The cover window 100 may include a transparent adhesive member such as an optically clear adhesive ("OCA") film. Although not shown in the drawings, in some embodiments, the cover window 100 may further include a light blocking area arranged in the form of a band surrounding the edges of the cover window 100. The light blocking area may overlap the non-display area of the display panel 200 to cover the non-display area. The light blocking area may be an opaque area. In some embodiments, the cover window 100 may further include a light blocking member with a predetermined width that is arranged along the edge of a rear surface thereof.

The display panel 200 may be a light emitting display panel 200 including light emitting elements. In an embodiment, the display panel 200 may be an organic light emitting display panel using an organic light emitting diode including an organic light emitting layer 172, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor, for example. In an embodiment, the display panel 200 may be an organic light emitting display panel, but the invention is not limited thereto.

The display panel 200 may have flexibility. In an embodiment, the display panel 200 may be a flexible display panel, for example. In this case, the display panel 200 may be bent to have a form corresponding to that of the cover window 100 and adhered to the cover window 100. In detail, the display panel 200 may be adhered onto the inner concave surface defined by the front and side members 110 and 120 of the cover window 100. In an embodiment, a front member 210, a first side member 220_1, a second side member 220_2, a third side member 220_3, and a fourth side member 220_4 of the display panel 200 to be described later may be adhered respectively to the front member 110, the first side member 120_1, the second side member 120_2, the third side member 120_3, and the fourth side member 120_4 of the cover window 100.

In the case where the display panel 200 is unfolded, the corners of the display panel 200 may each have a curvature (convex outward) in a plan view. The four corners of the display panel 200 may include a first corner CR1, a second corner CR2, a third corner CR3, and a fourth corner CR4 of a substrate SUB to be described later.

The display panel 200 may include the front member 210 and the side members 220.

The front member 210 of the display panel 200 may have a quadrangular (e.g., rectangular) shape with short sides in the first direction X and long sides in the second direction Y, but the invention is not limited thereto. The front member 210 of the display panel 200 may also have a shape of a different polygon, a circle, or an ellipse in a plan view. The front member 210 of the display panel 200 may have corners each having a curvature (convex outward) in a plan view. In some embodiments, the corners of the front member 210 may be bent in the thickness direction.

The side members 220 of the display panel 200 are arranged along the edges of the front member 210 of the display panel 200. In an embodiment, the side members 220 of the display panel 200 may surround an entirety of the edges of the front member 210 of the display panel 200. In some embodiments, the side members 220 of the display panel 200 may cover portions of the edges of the front member 210 of the display panel 200.

The side members 220 of the display panel 200 extend from the edges of the display panel 200 and are bent in the thickness direction. In an embodiment, the front member 210 and the side members 220 of the display panel 200 may define an angle in a range of about 70 degrees to about 120 degrees, for example, but the invention is not limited thereto.

The side members 220 may include a first side member 220_1, a second side member 220_2, a third side member 220_3, and a fourth side member 220_4.

The first side member 220_1, the second side member 220_2, the third side member 220_3, and the fourth side member 220_4 of the display panel 200 may respectively extend from a first side, a second side, a third side, and a fourth side of the front member 210 of the display panel 200. The first side member 220_1, the second side member 220_2, the third side member 220_3, and the fourth side member 220_4 of the display panel 200 may be respectively bent along a first bending line BL1, a second bending line BL2, a third bending line BL3, and a fourth bending line BL4 in the thickness direction. In FIGS. 1 and 2, the first side, the second side, the third side, and the fourth side may refer to an upper-right side, a lower-right side, a lower-left side, and an upper-left side, respectively.

The first side member 220_1, the second side member 220_2, the third side member 220_3, and the fourth side member 220_4 of the display panel 200 may surround an entirety of the edges of the front member 210 of the display panel 200. The first side member 220_1, the second side member 220_2, the third side member 220_3, and the fourth side member 220_4 of the display panel 200 may have respective outmost edges forming the circumference of the display panel 200.

The first side member 220_1, the second side member 220_2, the third side member 220_3, and the fourth side member 220_4 of the display panel 200 may each have a width which becomes smaller as it approaches the corner of the front member 210 of the display panel 200. Accordingly, gaps widening downward may be defined respectively between the first and second side members 220_1 and 220_2, between the second and third side members 220_2 and 220_3, between the third and fourth side members 220_3 and 220_4, and between the fourth and first side members 220_4 and 220_1. The edges of the first side member 220_1, the second side member 220_2, the third side member 220_3, and the fourth side member 220_4 of the display panel 200 may meet at the respective corners of the front member 210 of the display panel 200.

The display panel 200 may include a substrate SUB.

The substrate SUB may be a flexible substrate which may be bent, folded or rolled, and may include plastic. In an embodiment, the substrate SUB may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or any combination thereof, for example. In an alternative embodiment, the substrate SUB may include a metal material.

The substrate SUB may be disposed on the front member 210, the first side member 220_1, the second side member 220_2, the third side member 220_3, and the fourth side member 220_4 of the display panel 200.

The substrate SUB may have a size identical with or different from that of the cover window 100. In an embodiment, the substrate SUB may be smaller in size than the cover window 100. In some embodiments, the substrate SUB may have a size identical with or greater than that of the cover window 100.

The substrate SUB may have a quadrangular (e.g., rectangular) shape with short sides extending in the first direction X and long sides extending in the second direction Y. In an embodiment, the substrate SUB may have one side extending in a way of protruding outward to form a connection member BA and a pad member PA, which will be described later, but the invention is not limited thereto. In some embodiments, the connection member BA and the pad member PA may be respectively replaced by a ductile film and a circuit substrate SUB. The substrate SUB may also have a shape of a different polygon, a circle, or an ellipse in a plan view.

In the case where the substrate SUB is unfolded, the corners of the substrate SUB may each have a curvature (convex outward) in a plan view. In an embodiment, the edges of the side members of the substrate SUB to be described later may meet to form the corners of the substrate SUB. Here, the corners of the substrate SUB may have one curvature center. In some embodiments, the corners of the front member of the substrate SUB and the edges of the side members of the substrate SUB may be connected with each other to form the corners of the substrate SUB. In some embodiments, the edges at the corner of the front member of the substrate SUB may connect the adjacent edges of the side members of the substrate SUB. In some embodiments, the corners of the substrate SUB may be provided in such a way of being bent in the thickness direction.

Hereinafter, in FIG. 5, the upper-right corner of the substrate SUB is referred to as first corner CR1, the lower-right corner of the substrate SUB is referred to as second corner CR2, the lower-left corner of the substrate SUB is referred to as third corner CR3, and the upper-left corner of the substrate SUB is referred to as fourth corner CR4 for convenience of explanation.

As described above, the first corner CR1, the second corner CR2, the third corner CR3, and the fourth corner CR4 of the substrate SUB of the display panel 200 may respectively form the four corners of the display panel 200. Accordingly, the first corner CR1, the second corner CR2, the third corner CR3, and the fourth corner CR4 may denote the four respective corners of the display panel 200. The substrate SUB may further include a front member SUB_F arranged on the front member of the display panel and side members SUB_S arranged on the side members of the display panel. The substrate SUB may further include a connection member BA and a pad member PA.

The front member SUB_F of the substrate SUB may have a quadrangular (e.g., rectangular) shape with short sides in the first direction X and long sides in the second direction Y, but the invention is not limited thereto. The front member SUB_F of the substrate SUB may have a shape of a different polygon, a circle, or an ellipse in a plan view. The corners of the front member SUB_F of the substrate SUB may each have a curvature (convex outward) in a plan view. In some embodiments, the corners of the front member SUB_F of the substrate SUB may be bent in the thickness direction.

The side members SUB_S of the substrate SUB surround the front member SUB_F of the substrate SUB. In an embodiment, the side members SUB_S of the substrate SUB may surround an entirety of the edges of the front member SUB_F of the substrate SUB. In some embodiments, the side members SUB_S of the substrate SUB may surround at least portions of the edges of the front member SUB_F of the substrate SUB.

The side members SUB_S of the substrate SUB extend from the edges of the front member SUB_F of the substrate SUB to be bent in the thickness direction. In an embodiment, the front member SUB_F and the side members SUB_S of the substrate SUB may define an angle in a range of about 70 degrees to about 120 degrees, for example, but the invention is not limited thereto.

The side members SUB_S of the substrate SUB may include a first side member SUB_S1, a second side member SUB_S2, a third side member SUB_S3, and a fourth side member SUB_S4.

The first side member SUB_S1, the second side member SUB_S2, the third side member SUB_S3, and the fourth side member SUB_S4 of the substrate SUB extend respectively from the first side, the second side, the third side, and the fourth side of the of the front member SUB_F of the substrate SUB and are bent in the thickness direction. In FIGS. 1 and 2, the first side, the second side, the third side, and the fourth side may refer to an upper-left side, an upper-right side, a lower-right side, and a lower-left side, respectively. In FIG. 4 or 5, the first side, the second side, the third side, and the fourth side may refer to a top side, a right side, a bottom side, and a left side, respectively.

The first side member SUB_S1, the second side member SUB_S2, the third side member SUB_S3, and the fourth side member SUB_S4 of the substrate SUB may surround an entirety of the edges of the front member SUB_F of the substrate SUB. The first side member SUB_S1, the second side member SUB_S2, the third side member SUB_S3, and the fourth side member SUB_S4 of the substrate SUB may have respective outmost edges forming the circumference of the substrate SUB.

The first side member SUB_S1, the second side member SUB_S2, the third side member SUB_S3, and the fourth side member SUB_S4 of the substrate SUB may each have a width which becomes smaller as it approaches the corner of the front member SUB_F of the substrate SUB. Accordingly, gaps widening downward may be defined respectively between the first and second side members SUB_S1 and SUB_S2, between the second and third side members SUB_S2 and SUB_S3, between the third and fourth side members SUB_S3 and SUB_S4, and between the fourth and first side members SUB_S4 and SUB_S1. The edges of the first side member SUB_S1, the second side member SUB_S2, the third side member SUB_S3, and the fourth side member SUB_S4 of the substrate SUB may meet at the respective corners of the front member SUB_F of the substrate SUB.

The first side member SUB_S1, the second side member SUB_S2, the third side member SUB_S3, and the fourth side member SUB_S4 of the substrate SUB may each be bent to have a curvature (convex outward). The curvatures defined by the first side member SUB_S1, the second side member SUB_S2, the third side member SUB_S3, and the fourth side member SUB_S4 of the substrate SUB may be identical with or different from one another. In an embodiment, the first and third side members SUB_S1 and SUB_S3 of the substrate SUB may be bent to have a first curvature, and the second and fourth side members SUB_S2 and SUB_S4 of the substrate SUB may be bent to have a second curvature, for example.

The first side member SUB_S1, the second side member SUB_S2, the third side member SUB_S3, and the fourth side member SUB_S4 of the substrate SUB may be bent respectively along the first bending line BL1, the second bending line BL2, the third bending line BL3, and the fourth bending line BL4. The first bending line BL1, the second bending line BL2, the third bending line BL3, and the fourth bending line BL4 may be imaginary lines for bending. In an embodiment, the first and third bending lines BL1 and BL3 may extend in the first direction X, and the second and fourth bending lines BL2 and BL4 may extend in the second direction Y. In an embodiment, the first and second bending lines BL1 and BL2, the second and third bending lines BL2 and BL3, the third and fourth bending lines BL3 and BL4, and/or the fourth and first bending lines BL4 and BL1 may each meet or cross at an edge of the substrate SUB. In some embodiments, the first and second bending lines BL1 and BL2, the second and third bending lines BL2 and BL3, the third and fourth bending lines BL3 and BL4, and/or the fourth and first bending lines BL4 and BL1 may each cross inside or outside the substrate SUB in reference to the edges of the substrate SUB.

The first bending line BL1, the second bending line BL2, the third bending line BL3, and the fourth bending line BL4 may meet each other to form the corners. The corners provided by the bending lines may each have a curvature (convex outward) in a plan view. In some embodiments, the corners of the bending lines may be bent in the thickness direction. In an embodiment, the corners of the bending lines may contact the edges of the substrate SUB. In some embodiments, the corners of the bending lines may be arranged so as to be partially outside the edges of the substrate SUB. In some embodiments, the corners of the bending lines may be distanced inward from the edges of the substrate SUB.

The connection member BA extends from the lower side of the third side member SUB_S3. The connection member BA may be arranged between the third side member SUB_S3 and the pad member PA. The connection member BA may have a length shorter than that of the third side member SUB_S3 in the first direction X. The connection member BA may be bent along a fifth bending line BL5 below the third side member SUB_S3.

The pad member PA extends from the lower side of the connection member BA. The pad member PA may have a length longer than that of the connection member BA in the first direction X, but the invention is not limited thereto. The length of the pad member PA may be substantially identical with that of the connection member BA in the first direction X. The pad member PA may be bent along a sixth bending line BL6 below the connection member BA. The pad member PA may be arranged on the bottom surface of the front member SUB_F. In an embodiment, a pad PAD and an integrated driving circuit IDC for receiving digital video data and timing signals through the pad PAD may be arranged on the pad member PA.

The substrate SUB may further include a display area DA and a non-display area NDA.

The display area DA is an area for displaying an image. A plurality of pixels PX may be arranged in the display area DA. In an embodiment, the display area DA may be arranged across the front member SUB_F, the first side member SUB_S1, the second side member SUB_S2, the third side member SUB_S3, and the fourth side member SUB_S4 of the substrate SUB. Here, the display area DA may be spaced apart from the edges of the substrate SUB. In an embodiment, the pixels PX, scan lines SL and data lines DL connected to the pixels PX, and the like may be arranged in the display area DA.

The non-display area NDA is an area in which no image is displayed. The non-display area NDA may include no pixel PX. The non-display area NDA may be arranged in the form of a band surrounding the display area DA. The non-display area NDA may be arranged from the edges of the substrate SUB to the display area DA. The non-display area NDA may have a smaller area than that of the display area DA. A scan driver SDC for applying scan signals to the scan lines SL, fan-out lines for connecting the data lines DL and the integrated driving circuit IDC, a first power line VSSL, other outskirt lines and the like may be arranged in the non-display area NDA.

The non-display area NDA may be arranged at the edges of the first side member SUB_S1, the second side member SUB_S2, the third side member SUB_S3, and the fourth side member SUB_S4, and/or at the corners of the front member SUB_F. Referring to FIGS. 4 and 5, in an embodiment, the non-display area NDA may be arranged at the left, upper, and right edges of the first side member SUB_S1, at the upper, right, and lower edges of the second side member SUB_S2, at the right, lower, and left edges of the third side member SUB_S3, and at the lower, left, and upper edges of the fourth side member SUB_S4. Here, the non-display area NDA may be arranged at the first corner CR1 of the front member SUB_F that connects the right edge of the first side member SUB_S1 to the upper edge of the second side member SUB_S2, the second corner CR2 of the front member SUB_F that connects the lower edge of the second side member SUB_S2 to the right edge of the third side member SUB_S3, the third corner CR3 of the front member SUB_F that connects the left edge of the third side member SUB_S3 to the lower edge of the fourth side member SUB_S4, and the fourth corner CR4 of the front member SUB_F that connects the upper edge of the fourth side member SUB_S4 to the left edge of the first side member SUB_S1.

The display panel 200 may further include a thin film transistor ("TFT") layer TFTL, a light emitting element layer EML, and an encapsulation layer TFE that are arranged on the substrate SUB. The display panel 200 may further include a sensor electrode layer SENL.

The TFT layer TFTL, the light emitting element layer EML, the encapsulation layer TFE, and the sensor electrode layer SENL may be arranged between the cover window 100 and the substrate SUB. The TFT layer TFTL, the light emitting element layer EML, the encapsulation layer TFE, and the sensor electrode layer SENL may be bent as the substrate SUB is bent. In some embodiments, although not shown in the drawings, an adhesive layer may be arranged between the cover window 100 and the display panel 200. The TFT layer TFTL, the light emitting element layer EML, the encapsulation layer TFE, and the sensor electrode layer SENL will be described in detail hereinafter with reference to FIG. 8.

The display panel 200 may further include alignment marks AM.

The alignment marks AM may be used as identification marks for alignment in a process of bonding the display panel 200 with another member. In an embodiment, the another member may be the cover window 100.

The alignment marks AM may include an opaque material. The alignment marks AM, the TFT layer TFTL, the light emitting element layer EML, the encapsulation layer TFE, and the sensor electrode layer SENL may include the same material. The material may be metal. In an embodiment, the alignment marks AM may include at least one of molybdenum (Mo), aluminum (Al), chromium (Cr), gold (Au), titanium (Ti), nickel (Ni), neodymium (Nd) or copper (Cu), or any alloy thereof, for example.

The alignment marks AM may be arranged in at least one of the first corner CR1, the second corner CR2, the third corner CR3, or the fourth corner CR4. In an embodiment, the alignment marks AM may be arranged at the first corner CR1, the second corner CR2, the third corner CR3, and the fourth corner CR4, respectively. In detail, the alignment marks AM may be arranged in the non-display area NDA of the first corner CR1, the second corner CR2, the third corner CR3, and the fourth corner CR4.

Hereinafter, a description is directed to the arrangement of the alignment marks AM in detail with reference to FIGS. 6 to 9.

Figure 6:
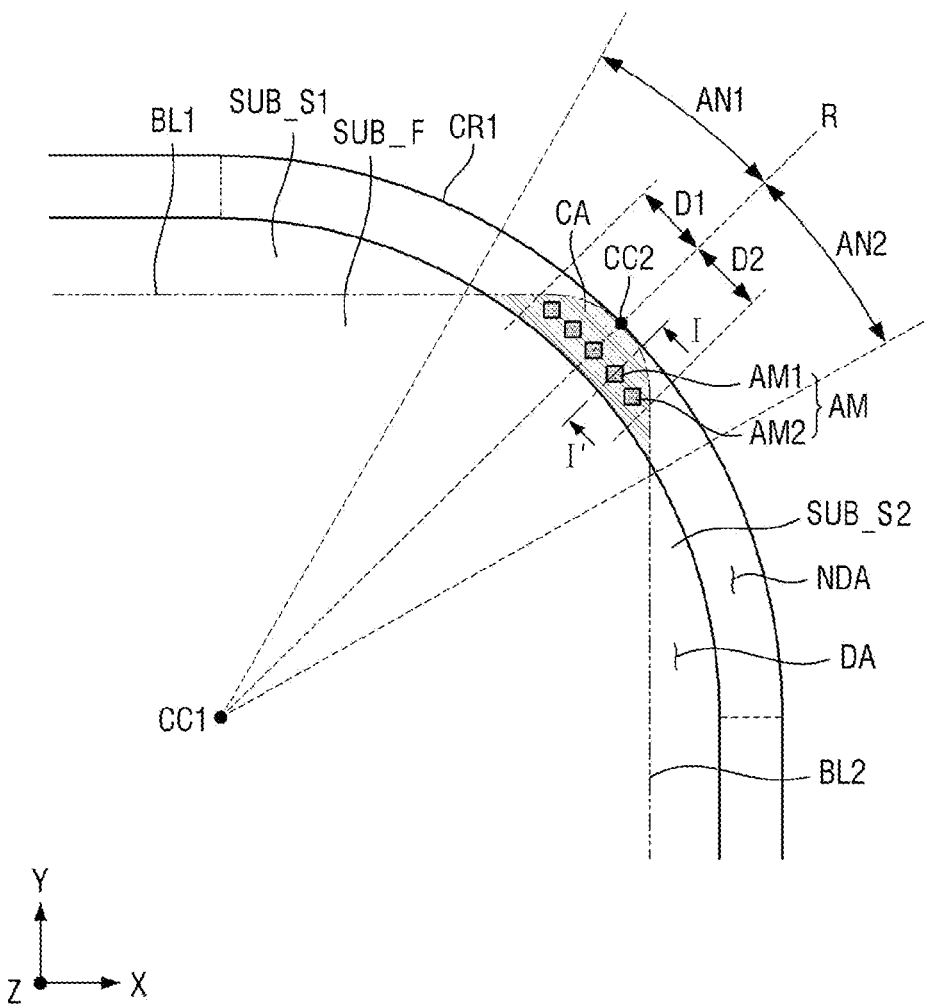
FIG. 6 is an enlarged plan view of the first corner of the display panel of FIG. 4 before the side members are bent.
Figure 7:
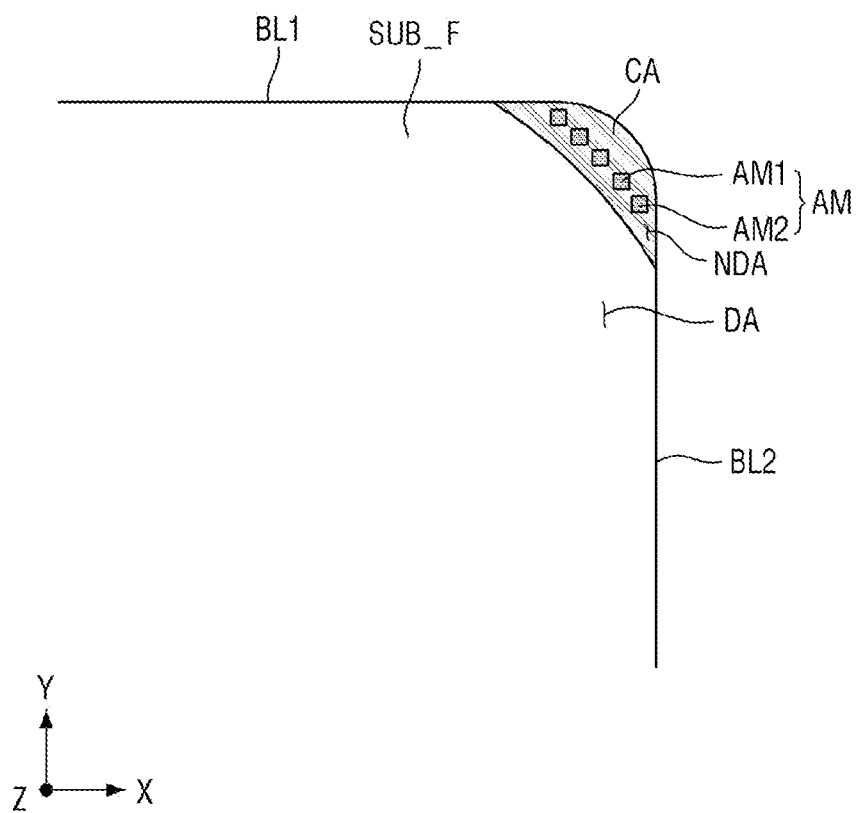
FIG. 7 is an enlarged plan view of an embodiment of the first corner of the display panel of the display device after the side members are bent.

FIG. 6 is an enlarged plan view of the first corner of the display panel of FIG. 4 before the side members are bent. FIG. 7 is an enlarged plan view of an embodiment of the first corner of the display panel of the display device after the side members are bent.

Because the alignment marks AM are arranged in substantially the same or similar manner at the first corner CR1, the second corner CR2, the third corner CR3, and the fourth corner CR4, the description is mainly directed to the alignment marks AM arranged at the first corner CR1 hereinafter.

With reference to FIGS. 6 and 7, the alignment marks AM may be arranged at a center area CA of the first corner CR1.

The center area CA of the first corner CR1 may be an area provided within a predetermined range from the center of the first corner CR1. The center area CA of the first corner CR1 may be spaced apart from the short side of the substrate SUB in the first direction X and the long side of the substrate SUB in the second direction Y. The center area CA of the first corner CR1 may have a size which is about ¼ of the size of the first corner CR1.

The center area CA of the first corner CR1 may be an area within a predetermined range from a reference line R. The reference line R may be an imaginary line passing through the center of the first corner CR1 and the curvature center of the first corner CR1. The reference line R may pass through a point bisecting an arc forming the edge of the first corner CR1. The reference line R may be a line forming a predetermined angle with the first bending line BL1 and/or the second bending line BL2. In an embodiment, the predetermined angle may be about 30 degrees to about 60 degrees, for example. In another embodiment, the predetermined angle may be about 45 degrees, for example.

The center area CA of the first corner CR1 may be an area within a predetermined distance range from the reference line R. In an embodiment, the center area CA of the first corner CR1 may be arranged within a first distance D1 in a counterclockwise direction and a second distance D2 in a clockwise direction from the reference line R. The first and second distances D1 and D2 may be equal to or different from each other. In an embodiment, the first and second distances D1 and D2 may be greater than 0 millimeter (mm) and equal to or less than 1 mm, for example. In another embodiment, the first distance D1 may be greater than 0 mm and equal to or less than 0.5 mm, and the second distance D2 may be greater than 0 and equal to or less than 1.5 mm, for example. Here, the curvature radius of the arc of the first corner CR1 may be about 8 mm to about 12 mm, and the length of the arc of the first corner CR1 may be about 15 mm to about 20 mm, for example.

The center area CA of the first corner CR1 may be an area within a predetermined angle range from the reference line R. In an embodiment, the center area CA of the first corner CR1 may be arranged within a first angle AN1 in the counterclockwise direction and a second angle AN2 in the clockwise direction from the reference line R with respect to the curvature radius of the first corner CR1. The first and second angles AN1 and AN2 may be equal to or different from each other. In an embodiment, the first and second angles AN1 and AN2 may be greater than about 0 degree and equal to or less than 15 degrees, for example. In another embodiment, the first angle AN1 may be greater than about 0 degree and equal to or less than 15 degrees, and the second angle AN2 may be greater than about 0 degree and equal to or less than 30 degrees, for example. In another embodiment, the first and second angles AN1 and AN2 may be about 11.25 degrees, for example.

The center area CA of the first corner CR1 may be a part of the non-display area NDA arranged on the front member SUB_F of the substrate SUB.

The center area CA of the first corner CR1 may be an area arranged inside the bending lines. In detail, the center area CA of the first corner CR1 may be an area arranged inward from the first and second bending lines BL1 and BL2 in the first corner CR1. The inward direction may be a direction toward the center of the substrate SUB. In an embodiment, the center area CA of the first corner CR1 may be a part of the first corner CR1 that is not bent downward. In some embodiments, the center area CA of the first corner CR1 may be bent as the first and second side members SUB_S1 and SUB_S2 are bent in the thickness direction. In this case, the alignment marks AM may also be bent in the thickness direction. The center area CA of the first corner CR1 may be less bent than the first and second side members SUB_S1 and SUB_S2. In an embodiment, the center area CA of the first corner CR1 and the center part of the front member SUB_F of the substrate SUB may have a height difference of about 0.2 mm to about 0.8 mm, for example.

With reference to FIG. 7, the display device 10 may facilitate perception of the alignment marks AM of the display panel 200 being bent along the bending lines extending in different directions. In detail, it is typical to arrange a camera VC (refer to FIG. 18) above (or in front of) or below (or in rear of) the substrate SUB to determine whether the substrate SUB and the cover window 100 are aligned during the bonding process. In the case of being arranged between the corners of the substrate SUB, e.g., straight sections of the non-display area NDA corresponding to the side members, the alignment marks AM may be difficult to be perceived by the camera VC or may be likely to be distorted as the side members SUB_S of the substrate SUB are bent. The alignment marks AM of the display device 10 in an embodiment may be arranged in the center area CA of the first corner CR1 as shown in FIG. 6 so as to minimize distortion caused by bending, even when all of the first to fourth side members SUB_S1 to SUB_S4 are bent, which leads to facilitation of perception of the alignment marks AM by the camera VC.

Furthermore, the alignment marks AM may be spaced apart from each other as far as possible in each of the first corner CR1, the second corner CR2, the third corner CR3, and the fourth corner CR4, which makes it possible to achieve more precise alignment, on the hypothesis that the same error occurs, in comparison with the case where the alignment marks AM are arranged between the corners of the substrate SUB.

The alignment marks AM may include a first mark AM1 and a second mark AM2. In an embodiment, the first and second marks AM1 and AM2 may be respectively arranged on two different layers among the plurality of layers deposited on the substrate SUB.

Hereinafter, the first and second marks AM1 and AM2 are described in detail with reference to FIGS. 8 and 9.

Figure 8:
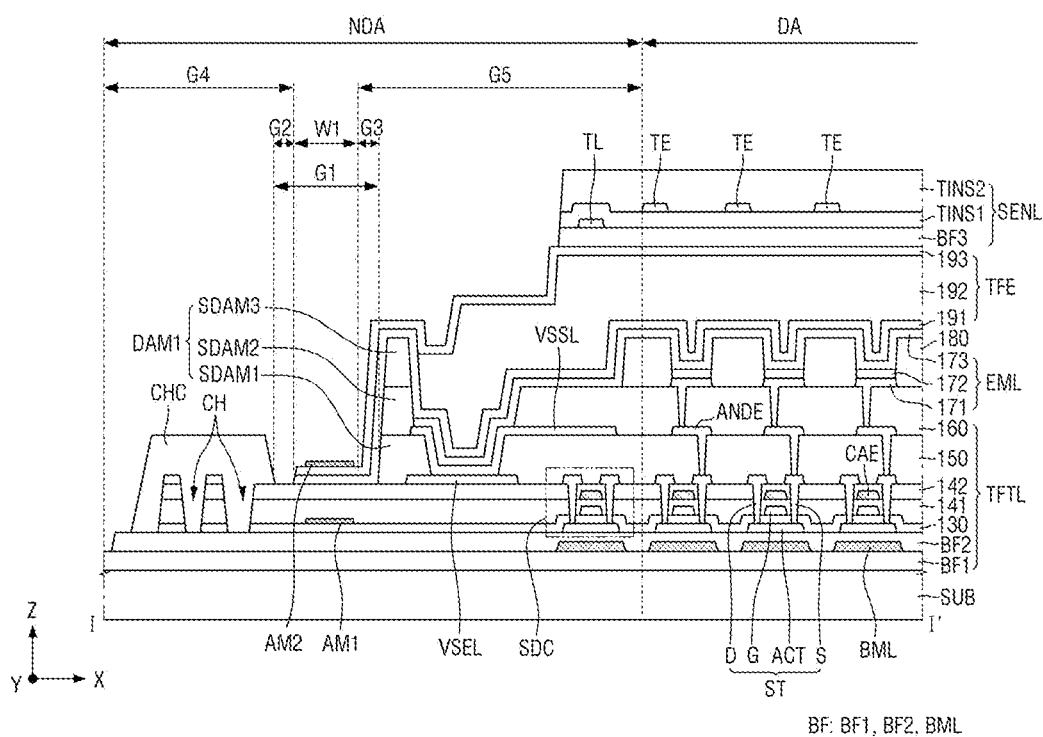
FIG. 8 is a cross-sectional view taken along line I-I' of FIG. 6.

FIG. 8 is a cross-sectional view taken along line I-I' of FIG. 6. FIG. 9 is a plan view of a non-display area of FIG. 8.

First, a description is directed to the stacked structure of the display panel 200 for convenience of explanation.

With reference to FIG. 8, the display panel 200 may further include a TFT layer TFTL on the substrate SUB, a light emitting element layer EML on the TFT layer TFTL, and an encapsulation layer TFE on the light emitting element layer EML. The display panel 200 may further include a sensor electrode layer SENL on the encapsulation layer TFE.

The TFT layer TFTL may include a TFT ST. The TFT ST may be implemented with an active layer ACT, a gate electrode G, a source electrode S, and a drain electrode D to be described later. The TFT ST may include a pixel transistor arranged in the display area DA and a scan driving transistor arranged in the non-display area NDA. In an embodiment, the scan driver SDC of the display panel 200 may be implemented with a scan driving transistor.

The TFT layer TFTL may further include a buffer layer BF, an active layer ACT on the buffer layer BF, a gate insulating layer 130 on the active layer ACT, a gate electrode G on the gate insulating layer 130, a first interlayer insulating layer 141 on the gate electrode G, a capacitor electrode CAE on the first interlayer insulating layer 141, and a second interlayer insulating layer 142 on the capacitor electrode CAE. The TFT layer TFTL may further include a source electrode S penetrating the insulating layers to contact one side of the active layer ACT, a drain electrode D penetrating the insulating layers to contact the other side of the active layer ACT, and a first organic layer 150 on the source electrode S and the drain electrode D. The TFT layer TFTL may further include a first power connection line VSEL on the second interlayer insulating layer 142, a first power line VSSL arranged on the first organic layer 150 and penetrating the first organic layer 150 to be connected to the first power connection line VSEL, a first connection electrode ANDE penetrating the first organic layer 150 to be connected to the drain electrode D, and a second organic layer 160 on the first connection electrode ANDE.

The buffer layer BF may include a first buffer layer BF1 disposed on the substrate SUB, a second buffer layer BF2 disposed on the first buffer layer BF1, and a light blocking layer BML arranged between the first and second buffer layers BF1 and BF2.

The light blocking layer BML, the gate electrode G, the source electrode S, the drain electrode D, the first power connection line VSEL, the first power line VSSL, and the first connection electrode ANDE may include a metal material. In an embodiment, the metal material may include any one of molybdenum (Mo), aluminum (Al), chromium (Cr), gold (Au), titanium (Ti), nickel (Ni), neodymium (Nd) and copper (Cu) or any alloy thereof, for example.

The active layer ACT may include polycrystalline silicon, monocrystalline silicon, low-temperature polycrystalline silicon, amorphous silicon, or an oxide semiconductor material. In an embodiment, the oxide semiconductor material may include metal such as indium (In), gallium (Ga), zinc (Zn), aluminum (Al), tin (Sn), zirconium (Zr), hafnium (Hf), cadmium (Cd), nickel (Ni), and copper (Cu). In the case where the active layer ACT includes polycrystalline silicon or an oxide semiconductor material, the ion-doped area of the active layer ACT may be a conductive area having conductivity.

The light emitting element layer EML is arranged on the second organic layer 160. The light emitting element layer EML may include a first light emitting electrode 171 on the second organic layer 160, an organic light emitting layer 172 on the first light emitting electrode 171, a second light emitting electrode 173 on the organic light emitting layer 172, and a bank 180 on the second organic layer 160.

The first and second light emitting electrodes 171 and 173 may include a metal material. In an embodiment, the metal material may include any one of molybdenum (Mo), aluminum (Al), chromium (Cr), gold (Au), titanium (Ti), nickel (Ni), neodymium (Nd) and copper (Cu) or any alloy thereof, for example.

The encapsulation layer TFE is arranged on the light emitting element layer EML. The encapsulation layer TFE may include a first inorganic layer 191 on the second light emitting electrode 173, a second inorganic layer 193 on the first inorganic layer 191, and an organic layer 192 between the first and second inorganic layers 191 and 193.

In an embodiment, the first inorganic layer 191 and the second inorganic layer 193 may include at least one of a silicon nitride layer, a silicon oxynitride layer, a silicon oxide layer, a titanium oxide layer, or an aluminum oxide layer, for example.

Portions of the first and second inorganic layers 191 and 193 may be arranged between a crack prevention hole CH and a dam DAM1 to be described later. In detail, portions of the first and second inorganic layers 191 and 193 may be arranged between the dam DAM1 and an organic layer cover CHC covering the crack prevention hole CH. Portions of the first and second inorganic layers 191 and 193 may be arranged flat on the second interlayer insulating layer 142. Portions of the first and second inorganic layer 191 and 193 may extend from the dam DAM1 to the organic layer cover CHC to be flat, maintaining a predetermined width, on the second interlayer insulating layer 142. In an embodiment, the predetermined width may be about 100 micrometers ($\mu m$) to about 150 $\mu m$, for example.

The edges of the first and second inorganic layers 191 and 193 may be disposed between the crack prevention hole CH and the dam DAM1. In detail, the second interlayer insulating layer 142 may be exposed between the organic layer cover CHC and the dam DAM1, and portions of the first and second inorganic layers 191 and 193 may cover at least a part of the second interlayer insulating layer 142. At least portions of the edges of the first and second inorganic layers 191 and 193 may overlap or may not overlap in the third direction Z. The edges of the first and second inorganic layers 191 and 193 may have a predetermined width from the organic layer cover CHC. In an embodiment, the predetermined width may be about 50 $\mu m$ to about 100 $\mu m$, for example.

The sensor electrode layer SENL is disposed on the encapsulation layer TFE. The sensor electrode layer SENL may be a touch electrode layer for sensing a touch of a human body or an object. The sensor electrode layer SENL may include a third buffer layer BF3 on the encapsulation layer TFE, a sensing line TL on the third buffer layer BF3, a first sensor insulating layer TINS1 on the sensing line TL, a sensing electrode TE on the first sensor insulating layer TINS1, and a second sensor insulating layer TINS2 on the sensing electrode TE.

The sensing line TL and the sensing electrode TE may include a metal material. In an embodiment, the metal material may include any one of molybdenum (Mo), aluminum (Al), chromium (Cr), gold (Au), titanium (Ti), nickel (Ni), neodymium (Nd) and copper (Cu) or any alloy thereof, for example.

The display panel 200 may further include an organic layer cover CHC and a dam DAM1, and a crack prevention hole CH may be defined in the display panel 200.

The crack prevention hole CH is defined close to the edge of the display panel 200. The crack prevention hole CH penetrates the first interlayer insulating layer 141, the second interlayer insulating layer 142, and the gate insulating layer 130. The crack prevention hole CH may prevent crack propagation.

The organic layer cover CHC covers the crack prevention hole CH. The organic layer cover CHC may be provided simultaneously with the first organic layer 150 or may be a part of the first organic layer 150. The organic layer cover CHC may have a predetermined distance inward from the outmost edge of the display panel 200. In an embodiment, the predetermined distance may be about 80 $\mu m$ to about 100 $\mu m$, for example. The organic layer cover CHC may have a predetermined width. In an embodiment, the predetermined width may be about 20 $\mu m$ to about 40 $\mu m$, for example.

The dam DAM1 surrounds the edge of the organic layer 192 of the encapsulation layer TFE in the non-display area NDA. The dam DAM1 may prevent the organic layer 192 of the encapsulation layer TFE from overflowing. The dam DAM1 may include a first sub-dam SDAM1 provided with the same material as that of the first organic layer 150, a second sub-dam SDAM2 provided with the same material as that of the second organic layer 160, and a third sub-dam SDAM3 provided with the same material as that of the bank 180.

The dam DAM1 may cause one end of the organic layer 192 of the encapsulation layer TFE to be arranged between the display area DA and the dam DAM1. The first and second inorganic layers 191 and 193 may be arranged on the dam DAM1. The first and second inorganic layers 191 and 193 may contact each other on the dam DAM1.

The dam DAM1 may be arranged at a more inner side of the display panel 200 than the crack prevention hole CH and/or the organic layer cover CHC. The dam DAM1 may have a predetermined distance from the edge of the display panel 200. In an embodiment, the predetermined distance may be about 285 $\mu m$ to about 335 $\mu m$, for example.

Figure 9:
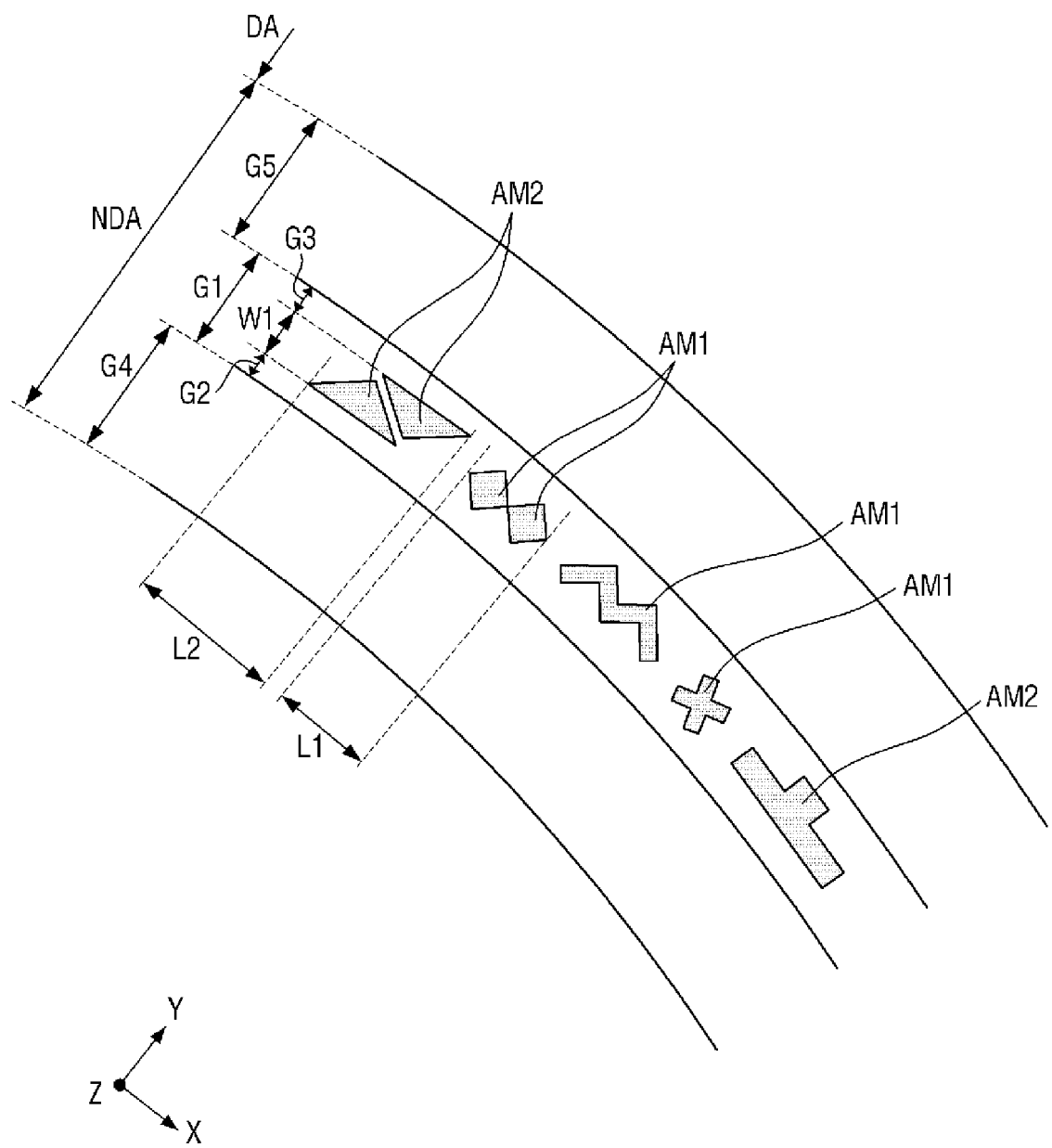
FIG. 9 is a plan view of a non-display area of FIG. 8.

With reference to FIGS. 8 and 9, the alignment marks AM are arranged in the non-display area NDA as described above. The alignment marks AM may be arranged between the crack prevention hole CH and the dam DAM1. In an embodiment, the alignment marks AM may be arranged between the dam DAM1 and the organic layer cover CHC covering the crack prevention hole CH.

The alignment marks AM may have a first width W1 between the organic layer cover CHC and the dam DAM1. The first width W1 may be less than a first distance G1 between the organic layer cover CHC and the dam DAM1. In an embodiment, the first distance G1 may be about 180 $\mu m$ to about 220 $\mu m$, and the first width W1 may be about 50 $\mu m$ to about 150 $\mu m$, for example. In another embodiment, the first distance G1 may be about 190 $\mu m$ to about 200 $\mu m$, and the first width W1 may be about 70 $\mu m$ to about 100 $\mu m$, for example. The first width W1 may be a difference between the sum of second and third distances G2 and G3 to be described later and the first distance G1. In an embodiment, the alignment marks AM may be arranged between the dam DAM1 and the edge of the first inorganic layer 191 and/or the second inorganic layer 193. In some embodiments, the second mark AM2 to be described later may have a width larger than that between the edge of the first inorganic layer 191 and/or the second inorganic layer 193 and the dam DAM1 so as to partially flow down along the side surface of the first inorganic layer 191 and/or the second inorganic layer 193.

The alignment marks AM may be spaced apart as much as the second distance G2 from the organic layer cover CHC. The second distance G2 may be a distance between at least one of the edges of the first and second inorganic layers 191 and 193 and the organic layer cover CHC. In an embodiment, the second distance G2 may be about 40 μm to about 60 μm, for example. As another embodiment, the second distance G2 may be about 50 μm, for example.

The alignment marks AM may be spaced apart as much as the third distance G3 from the dam DAM1. In an embodiment, the third distance G3 may be equal to the second distance G2. In an embodiment, the third distance G3 may be about 40 μm to about 60 μm, for example. In another embodiment, the third distance G3 may be about be about 50 μm, for example. In some embodiments, the third distance G3 may be greater or less than the second distance G2.

The alignment marks AM may be spaced apart as much as a fourth distance G4 from the edge of the display panel 200. The edge of the display panel 200 may correspond to the edge of the substrate SUB. The fourth distance G4 may be greater than the second distance G2 and/or the third distance G3. The fourth distance G4 may be less than the first distance G1. In an embodiment, the fourth distance G4 may be about 160 μm to about 180 μm, for example.

The alignment marks AM may be spaced apart as much as a fifth distance G5 from the display area DA. The fifth distance G5 may be greater than each of the first to fourth distances G1 to G4. In an embodiment, the fifth distance G5 may be about 500 μm to about 600 μm, for example.

With reference to FIGS. 8 and 9, the alignment marks AM may include the first mark AM1 and the second mark AM2 as described above.

The first and second marks AM1 and AM2 may be respectively arranged on two different layers among the plurality of layers constituting the display panel 200. The second mark AM2 may be arranged above the first mark AM1. In an embodiment, the first mark AM1 may be arranged on a first layer, and the second mark AM2 may be arranged on a second layer disposed above the first layer. The second layer may be arranged directly on the first layer, and at least one other layer may be arranged between the first and second layers. In some embodiments, the second layer may be a layer disposed below the first layer. In some embodiments, the first and second marks AM1 and AM2 may be arranged on the same layer among the plurality of layers constituting the display panel 200.

The first layer may be a layer arranged between different layers constituting the display panel 200. In this case, the first mark AM1 may be arranged between the plurality of layers constituting the display panel 200 so as not to be exposed.

The second layer may have a top surface of which at least part is not covered by another layer. The second layer may be a layer having a top surface of which at least part is exposed. In this case, the second mark AM2 may be exposed upward. The second layer may be the topmost layer of the plurality of layers constituting the display panel 200.

In an embodiment, the first layer may be the gate insulating layer 130, and the second layer may be the second inorganic layer 193. In detail, the first mark AM1 may be arranged between the gate insulating layer 130 and the first interlayer insulating layer 141, and the second mark AM2 may be arranged on the second inorganic layer 193 to be exposed upward.

A layer arranged on the first and second layers and the alignment marks AM may include the same material. The alignment marks AM may be provided together with the layer disposed on the layer on which the alignment marks AM are arranged. In detail, the first mark AM1 and the layer disposed on the first layer may be provided together, and the second mark AM2 and the layer disposed on the second layer may be provided together. The layers including the same material as that of the alignment marks AM may be at least one of the light blocking layer BML, the active layer ACT, the gate electrode G, the source electrode S, the drain electrode D, the first power connection line VSEL, the first power line VSSL, the first light emitting electrode 171, the second light emitting electrode 173, the sensing line TL, or the sensing electrode TE. In an embodiment, the above material may include a metal material such as one of indium (In), gallium (Ga), zinc (Zn), tin (Sn), zirconium (Zr), hafnium (Hf), cadmium (Cd), nickel (Ni), copper (Cu), molybdenum (Mo), aluminum (Al), chromium (Cr), gold (Au), titanium (Ti), and neodymium (Nd) or any alloy thereof, for example. The alignment marks AM may be a single layer or multiple layers. In an embodiment, the first mark AM1 may be provided together with the gate electrode G, and the second mark AM2 may be provided together with the sensing electrode TE or the sensing line TL.

With reference to FIGS. 8 and 9, in an embodiment, a plurality of first marks AM1 and a plurality of second marks AM2 may be arranged so as not to overlap each other in the third direction Z. In some embodiments, the first and second marks AM1 and AM2 may also overlap each other in the third direction Z.

The first and second marks AM1 and AM2 may be arranged alternately. In an embodiment, three first marks AM1 may be arranged between two second marks AM2. In some embodiments, one second mark AM2 and three first marks AM1 may be alternately arranged.

The first and second marks AM1 and AM2 may be spaced apart in the first direction X and/or the second direction Y. In an embodiment, the plurality of first marks AM1 and the plurality of second marks AM2 may be spaced apart as much as about 100 μm to about 300 μm from each other, for example. The distance between the first and second marks AM1 and AM2 may be equal to the distance between the first marks AM1 or between the second marks AM2. In some embodiments, the distance between the first and second marks AM1 and AM2 may be greater than the distance between the second marks AM2.

The first and second marks AM1 and AM2 may have various shapes such as a triangle, a quadrangle, a rhombus, or a cross. The plurality of first marks AM1 and the plurality of second marks AM2 may have different shapes. The first mark AM1 and/or the second mark AM2 may each have a length greater than or equal to the width thereof.

The first and second marks AM1 and AM2 may differ in size. The second mark AM2 may be larger in size than the first mark AM1. In detail, the second mark AM2 may be greater in size than the first mark AM1 because of being disposed on the inorganic layer of the encapsulation layer TFE which has a relatively large available space in comparison with the TFT layer TFTL or the substrate SUB on which various lines or elements are arranged. Accordingly, the second mark AM2 may be perceived more easily than the first mark AM1. The first and second marks AM1 and AM2 may have the same width, but a length L1 of the first mark AM1 may be less than a length L2 of the second mark AM2. In an embodiment, the first and second marks AM1 and AM2 may each have a width of about 70 μm to about 100 μm, for example. In another embodiment, the length L1 of the first mark AM1 may be equal to or less than about 300 μm, and the length L2 of the second mark AM2 may be greater than about 300 μm, for example. In another embodiment, the length L2 of the second mark AM2 may be about 330 μm to about 360 μm, for example.

The display device 10 in an embodiment may minimize distortion of the alignment marks AM. In detail, in the case of being arranged between a plurality of layers, the alignment marks AM are likely to be distorted by the boundaries of the plurality of layers. In an embodiment, in the case of being provided to overlap the edge of the first inorganic layer 191 and/or the second inorganic layer 193, due to the distortion of the first mark AM1, it is difficult for the camera VC to perceive the first mark AM1 or an error is likely to occur, for example. Here, in the case where the second mark AM2 is arranged on the topmost layer, e.g., the second inorganic layer 193, among the plurality of layers constituting the display panel, the camera VC may perceive the second mark AM2 and correct the error. The second mark AM2 is exposed upward to make it possible to minimize distortion caused by the boundaries of the other layers. The second mark AM2 may be arranged on the first and second inorganic layers 191 and 193 so as to partially flow down along the side surfaces of the first and second inorganic layers 191 and 193. This may also distort the second mark AM2. In this case, the error caused by the distortion of the second mark AM2 may be corrected by referring to the first mark AM1. Because of being arranged flat on the gate insulating layer 130 or the like, the first mark AM1 is unlikely to undergo distortion caused by flowing-down in comparison with the second mark AM2. That is, the first and second marks AM1 and AM2 may function complementarily to each other. Furthermore, the camera VC may be arranged above (or in front of) or below (or in rear of) the display panel 200 to selectively use a less distorted one of the first and second marks AM1 and AM2.

Figure 10:
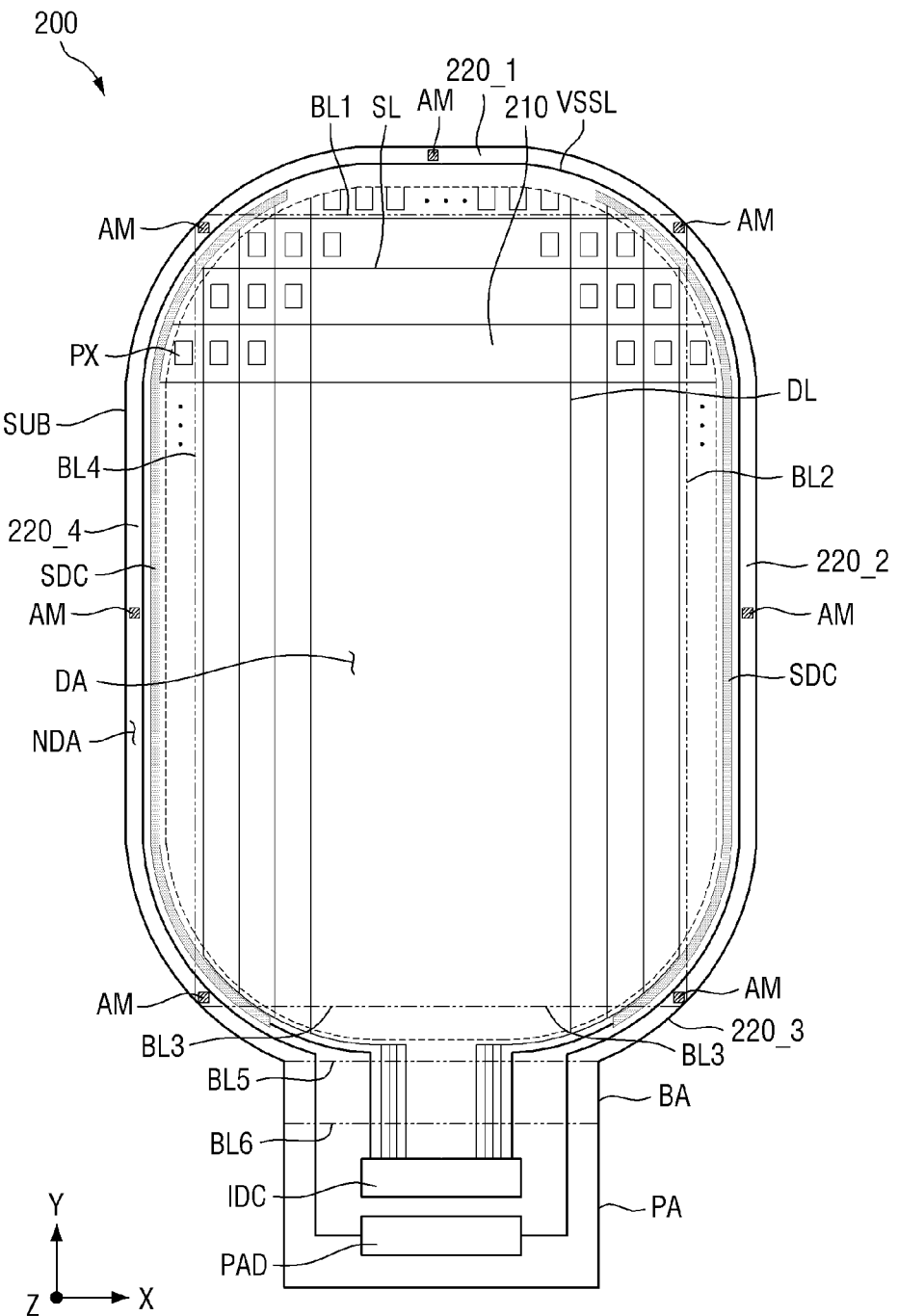
FIG. 10 is a plan view of another embodiment of a display panel of a display device.

FIG. 10 is a plan view of another embodiment of a display panel of a display device.

The embodiment of FIG. 10 differs from the embodiment of FIGS. 1 to 9 in that the alignment marks AM are further arranged along the short and long sides of the substrate SUB.

With reference to FIG. 10, the alignment marks AM may also be arranged on the short sides in the first direction X and the long sides in the second direction Y between the corners of the non-display area NDA.

In an embodiment, the alignment marks AM may be arranged in the first corner CR1, the second corner CR2, the third corner CR3, and the fourth corner CR4 (refer to FIG. 5), the long side between the first and second corners CR1 and CR2, the long side between the third and fourth corners CR3 and CR4, and the short side between the fourth and first corners CR4 and CR1, but the invention is not limited thereto. In some embodiments, the alignment marks AM may be arranged only in the short sides and/or the long sides.

The alignment marks AM arranged between the corners and the alignment marks AM arranged in the corners may perform different functions. In an embodiment, the alignment marks AM arranged between the corners may be used for bonding of an adhesive member and the display panel 200, and the alignment marks AM arranged in the corners may be used for bonding of the cover window 100 and the display panel 200, for example. In an embodiment, the adhesive member may include an OCA, for example.

Because the alignment marks AM are substantially identical with or similar to those in the embodiment of FIGS. 1 to 7 in shape, size, kind, and arrangement, detailed descriptions thereof are omitted hereinafter to avoid redundancy.

FIGS. 11 to 14 are cross-sectional views of a display panel of a display device according to still other embodiments.

Figure 11:
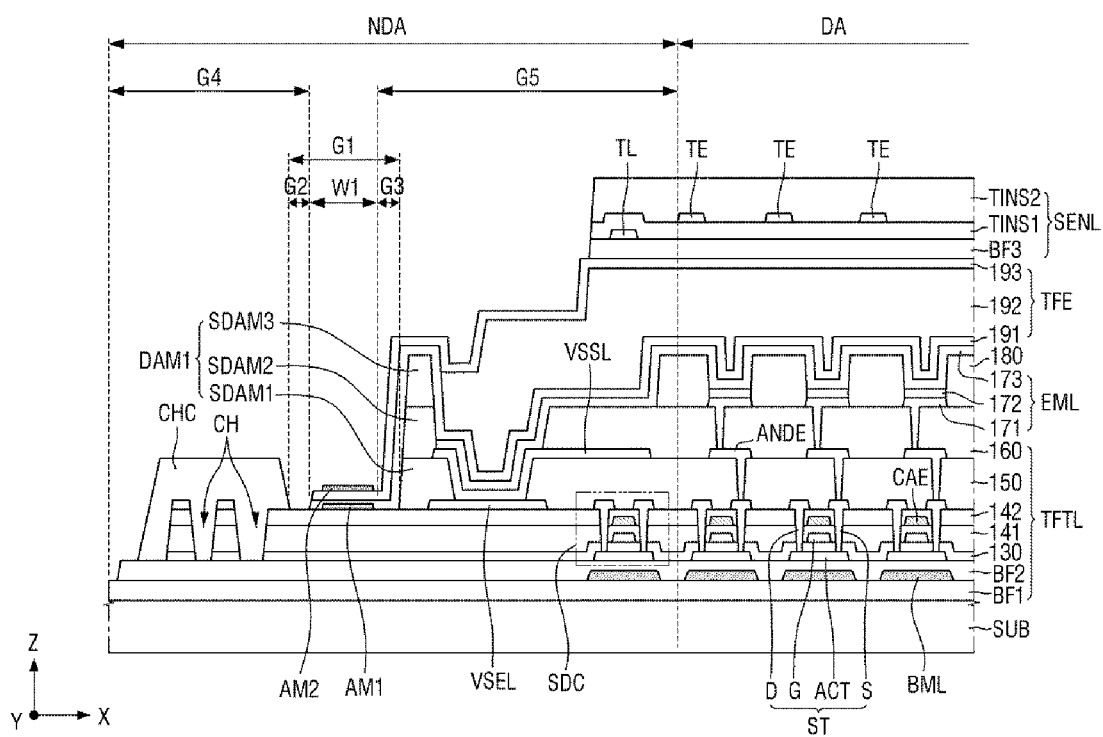
FIGS. 11 to 14 are cross-sectional views of a display panel of a display device according to still other embodiments.
Figure 12:
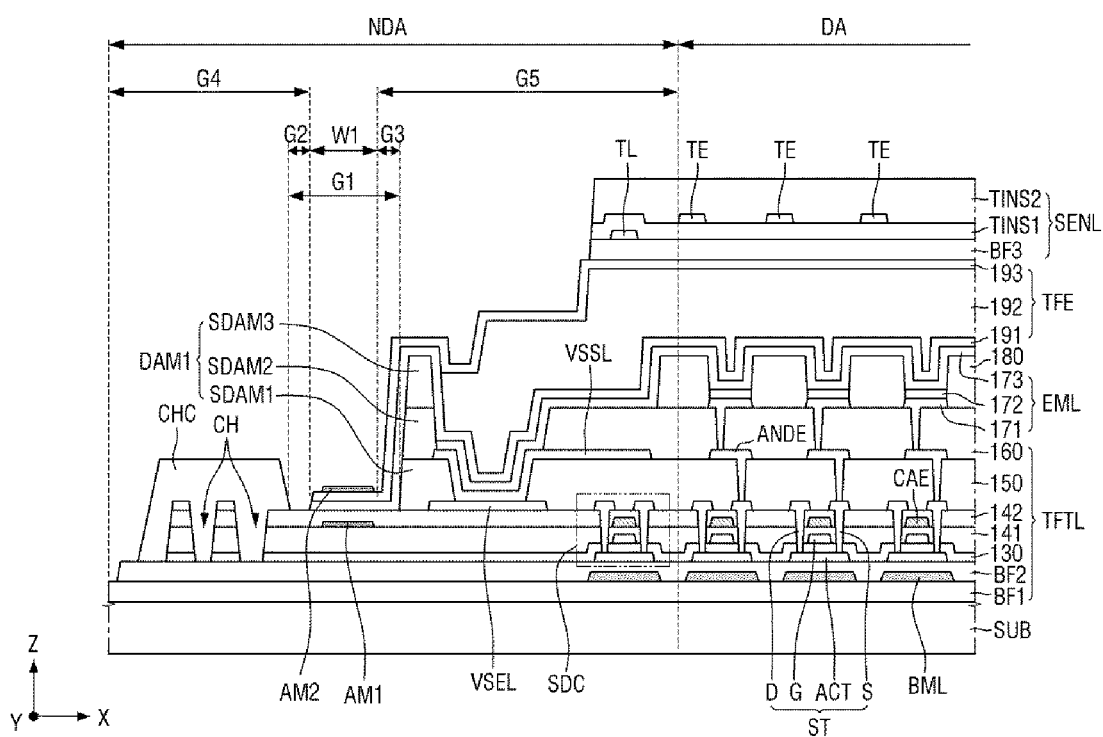
Figure 13:
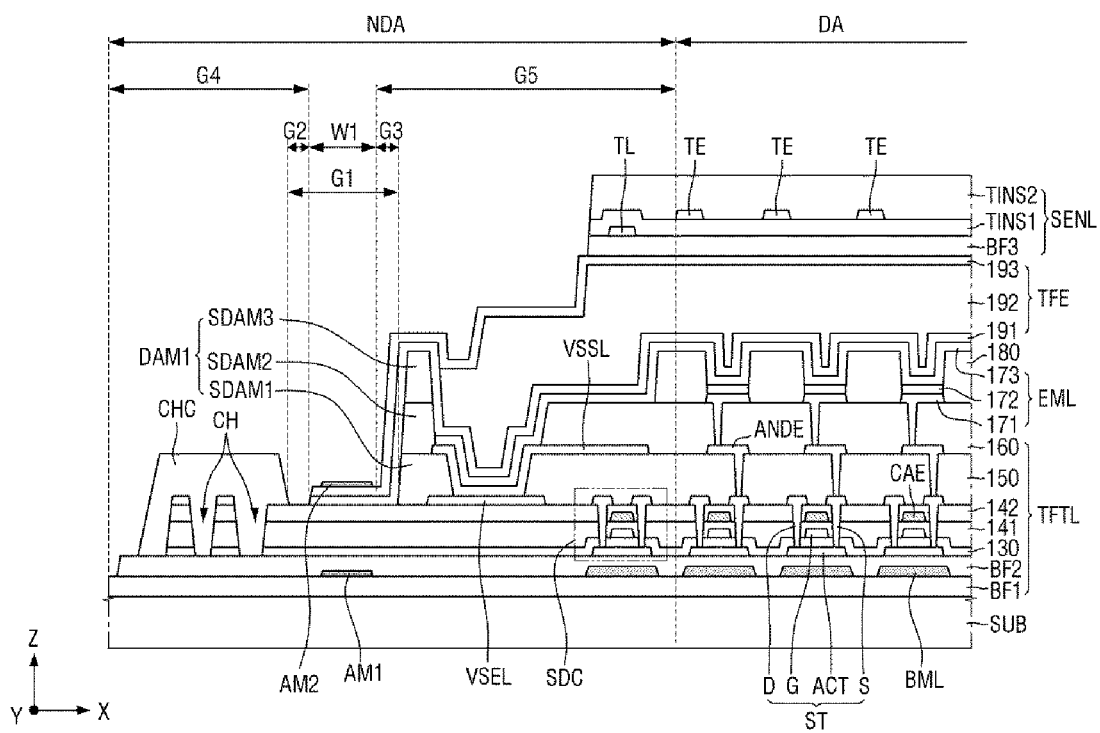
Figure 14:
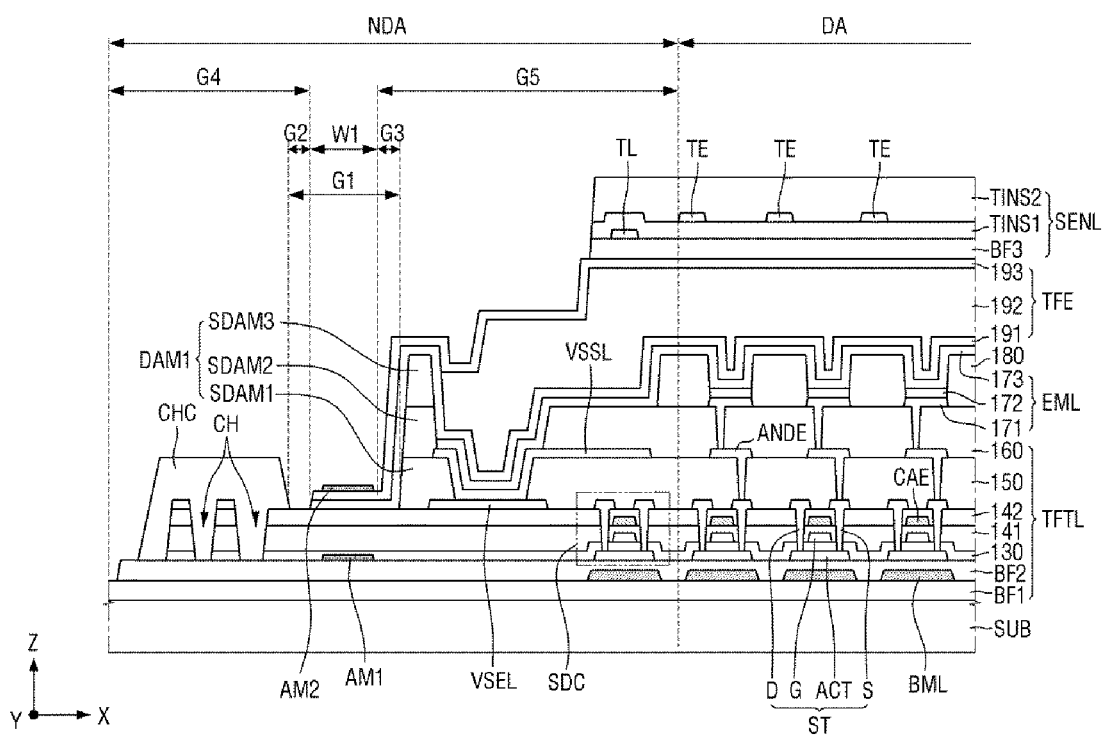

FIG. 11 is a cross-sectional view of the display panel 200 in which the first mark AM1 is disposed on the second interlayer insulating layer 142. FIG. 12 is a cross-sectional view of the display panel 200 in which the first mark AM1 is disposed on the first interlayer insulating layer 141. FIG. 13 is a cross-sectional view of the display panel 200 in which the first mark AM1 is disposed on the first buffer layer BF1. FIG. 14 is a cross-sectional view of the display panel 200 in which the first mark AM1 is disposed on the second buffer layer BF2.

The embodiments of FIGS. 11 to 14 are different from the embodiment of FIGS. 1 to 9 in the layer on which the first mark AM1 is disposed.

With reference to FIGS. 11 to 14, the second mark AM2 may be disposed on the second inorganic layer 193. The second mark AM2 may be exposed upward. The second mark AM2 may include a material that is the same as that of the sensing electrode TE or the sensing line TL. The second mark AM2 may be provided together with the sensing electrode TE or the sensing line TL.

With reference to FIG. 11, the first mark AM1 may be arranged on the second interlayer insulating layer 142. In detail, the first mark AM1 may be arranged between the second interlayer insulating layer 142 and the first inorganic layer 191. The first mark AM1 may include a material that is the same as that of the source electrode S, the drain electrode D, the first connection electrode ANDE, the first power connection line VSEL, or the first power line VSSL. The first mark AM1 may be provided together with one of the source electrode S, the drain electrode D, the first connection electrode ANDE, the first power connection line VSEL, and the first power line VSSL.

With reference to FIG. 12, the first mark AM1 may be arranged on the first interlayer insulating layer 141. In detail, the first mark AM1 may be arranged between the first interlayer insulating layer 141 and the second interlayer insulating layer 142. The first mark AM1 may include a material that is the same as that of the capacitor electrode CAE. The first mark AM1 may be provided together with the capacitor electrode CAE.

With reference to FIG. 13, the first mark AM1 may be arranged on the first buffer layer BF1. In detail, the first mark AM1 may be arranged between the first buffer layer BF1 and the second buffer layer BF2. The first mark AM1 may include a material that is the same as that of the light blocking layer BML. The first mark AM1 may be provided together with the light blocking layer BML.

With reference to FIG. 14, the first mark AM1 may be arranged on the second buffer layer BF2. In detail, the first mark AM1 may be arranged between the first buffer layer BF1 and the gate insulating layer 130. The first mark AM1 may include a material that is the same as that of the active layer ACT. The first mark AM1 may be provided together with the active layer ACT. Because the alignment marks AM are substantially identical with or similar to those in the embodiment of FIGS. 1 to 8 in shape, size, kind, and arrangement, detailed descriptions thereof are omitted hereinafter to avoid redundancy.

Hereinafter, a description is directed to a method of manufacturing the display device 10 using the alignment marks AM with reference to FIGS. 15 to 19.

Figure 15:
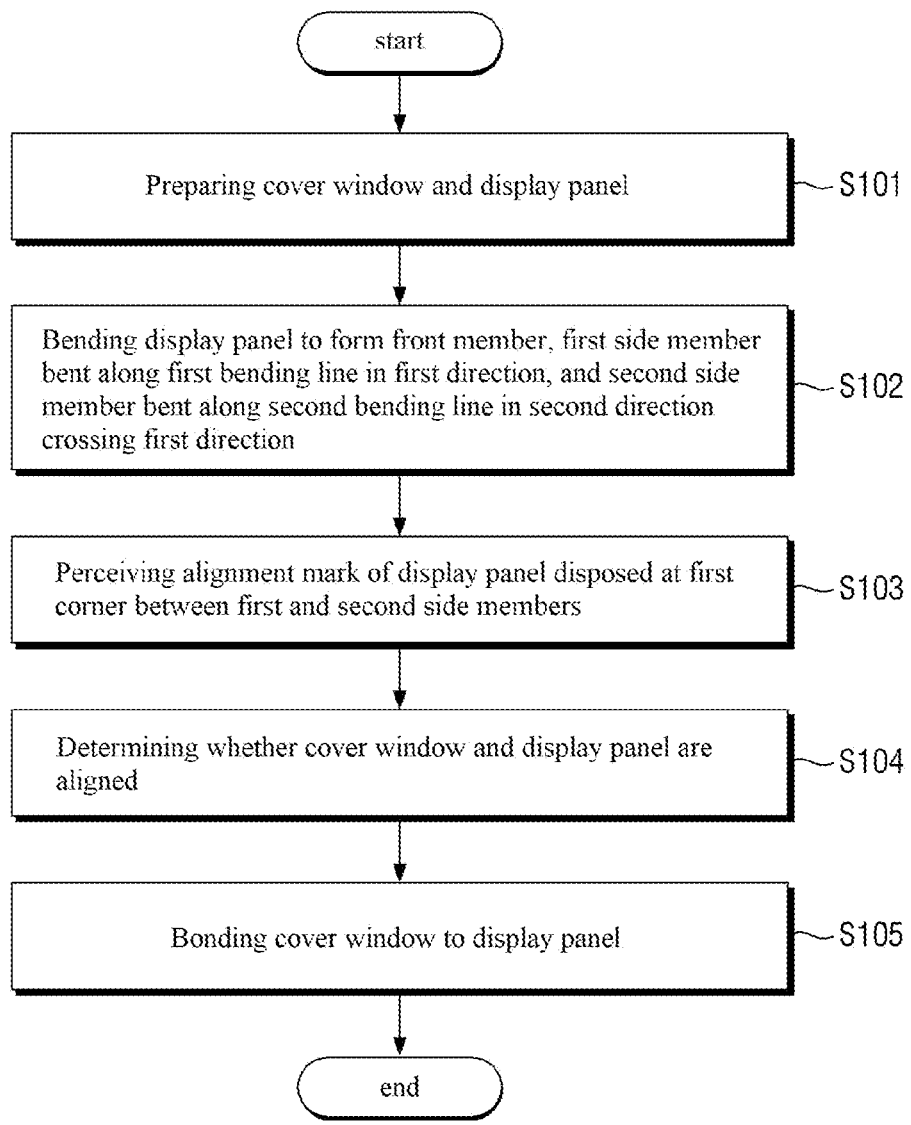
FIG. 15 is a flowchart illustrating a method of manufacturing a display device.
Figure 16:
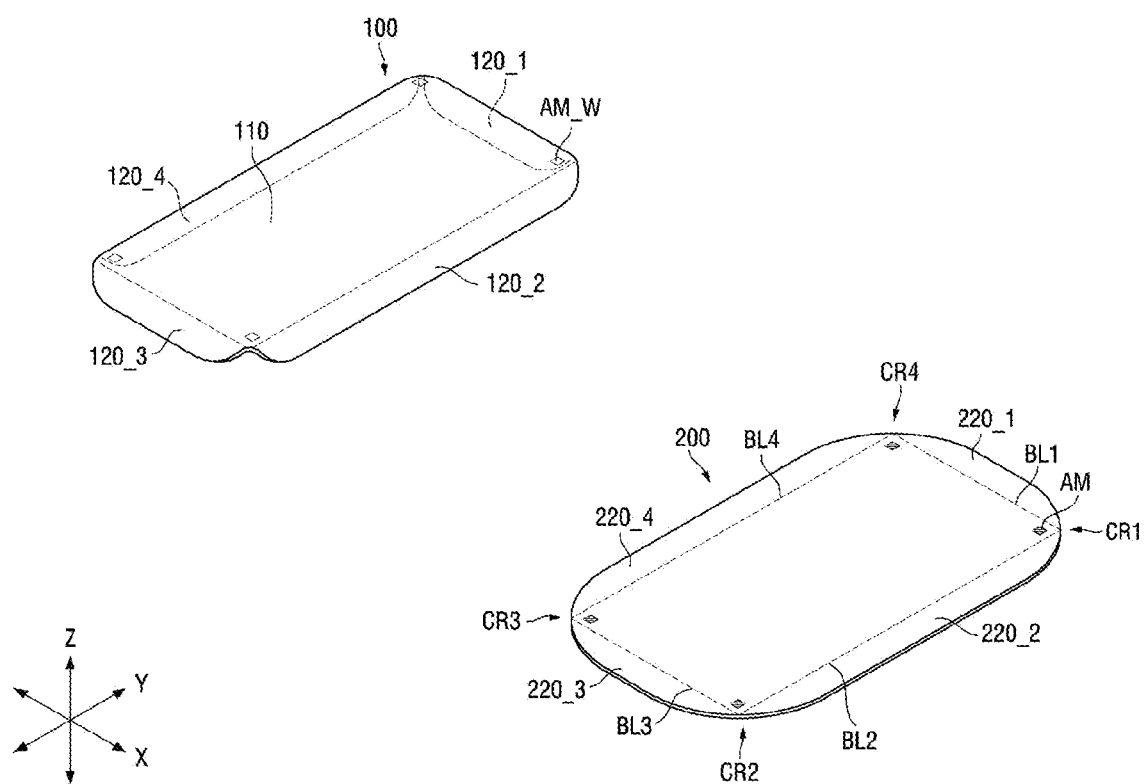
FIG. 16 is a view illustrating preparing of a cover window and a display panel.
Figure 17:
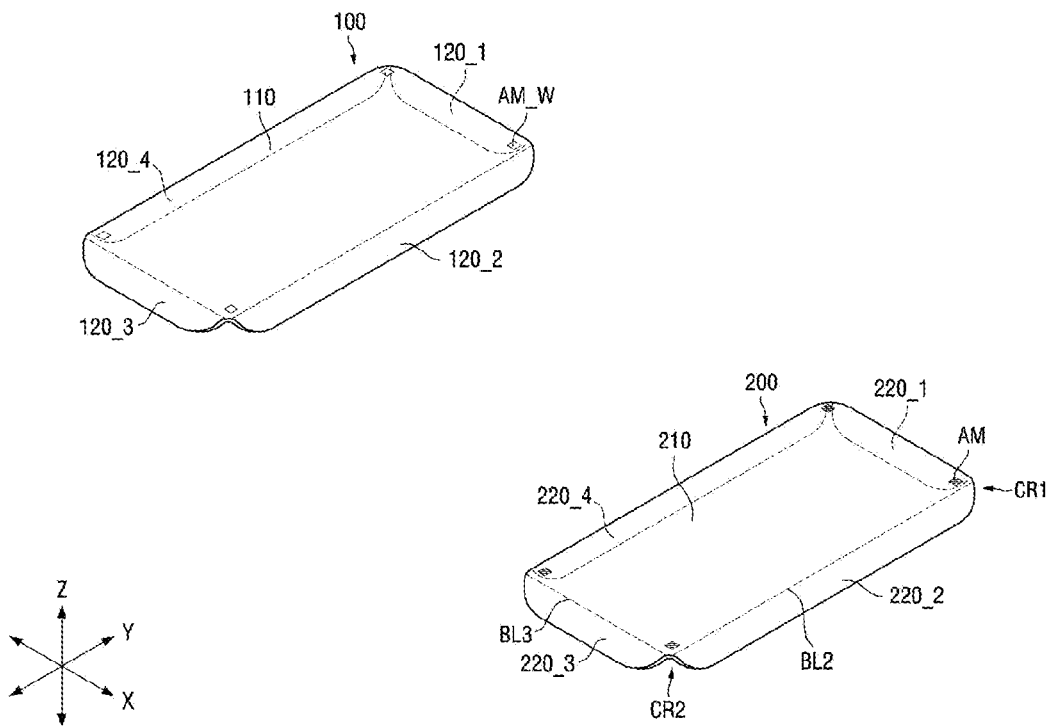
FIG. 17 is a view illustrating bending of a display panel.
Figure 18:
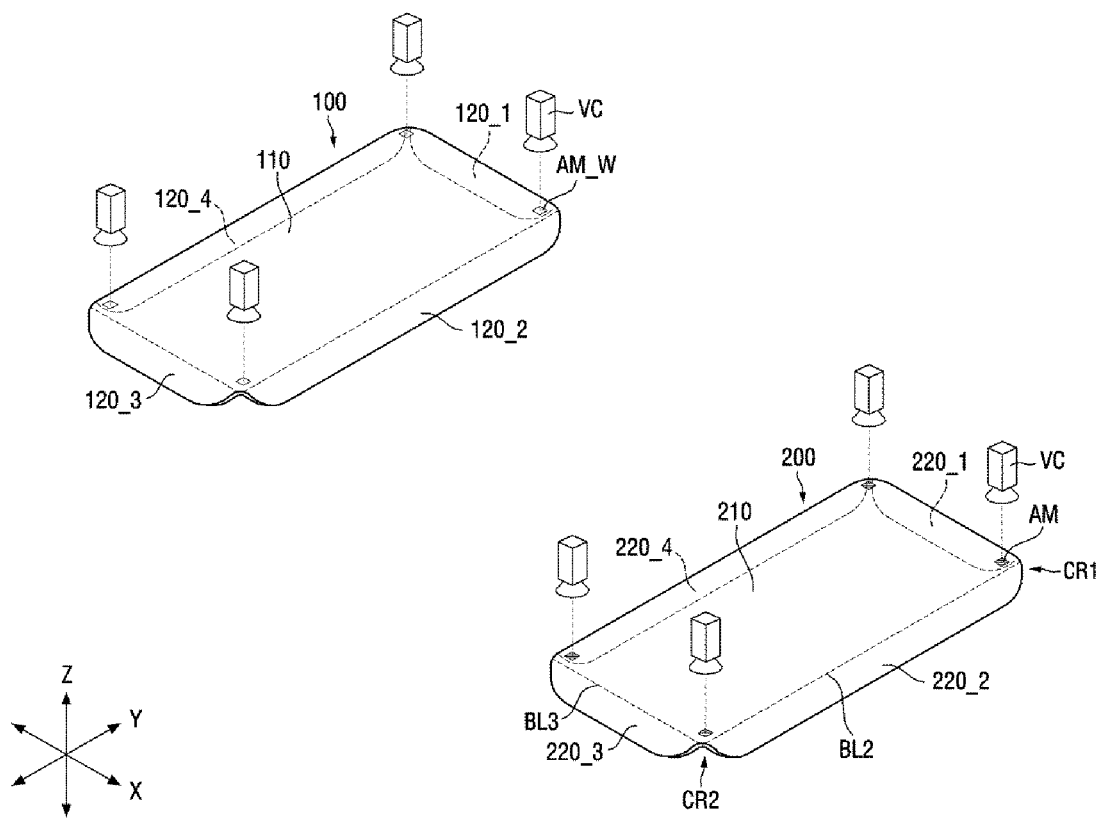
FIG. 18 is a view illustrating aligning of a display panel and a cover window.
Figure 19:
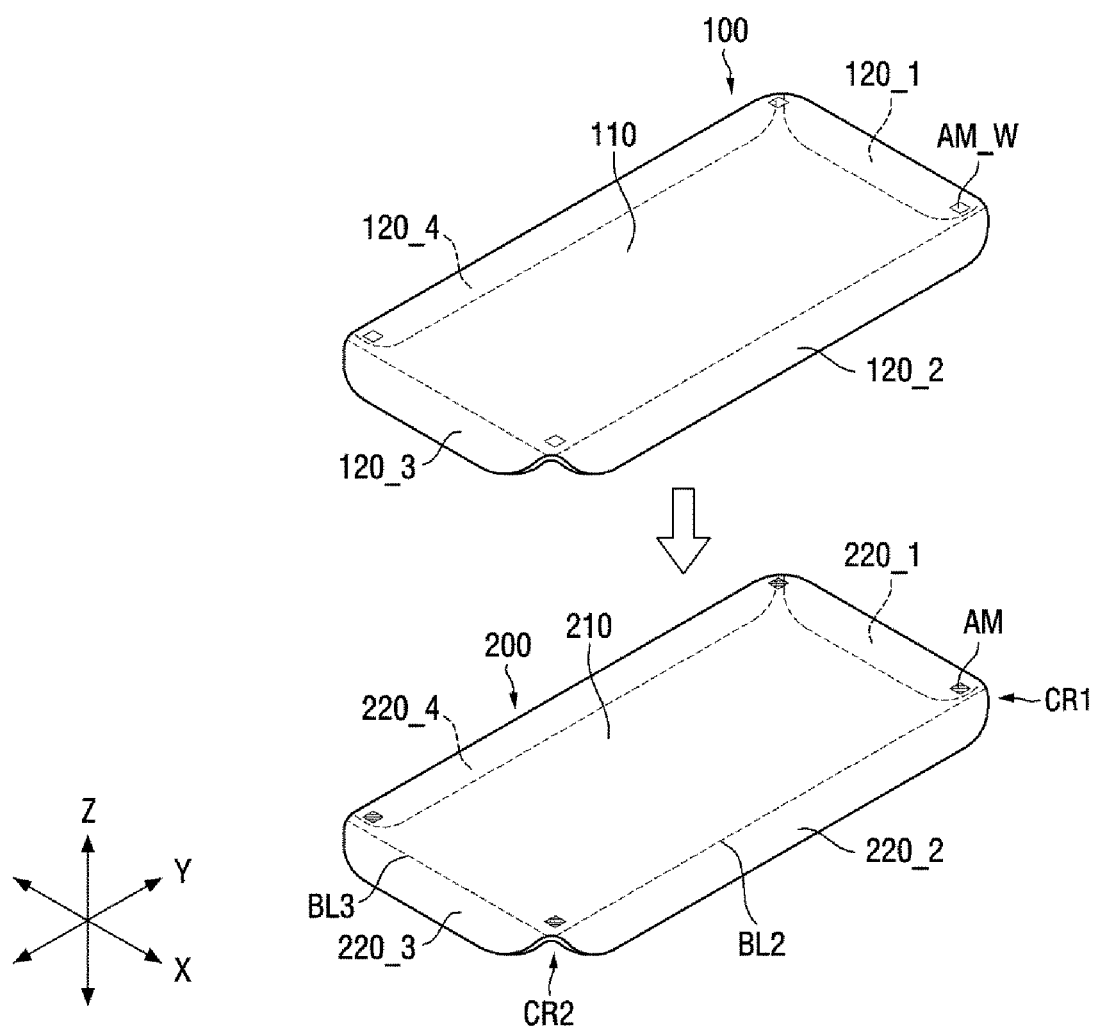
FIG. 19 is a view illustrating bonding of a display panel and a cover window.

FIG. 15 is a flowchart illustrating a method of manufacturing a display device. FIG. 16 is a view illustrating preparing of a cover window and a display panel. FIG. 17 is a view illustrating bending of a display panel. FIG. 18 is a view illustrating aligning of a display panel and a cover window. FIG. 19 is a view illustrating bonding of a display panel and a cover window.

With reference to FIGS. 15 to 19, a method of manufacturing the display panel 10 in an embodiment may include preparing the cover window 100 and the display panel 200 (operation S101), bending the display panel 200 to form the front member 210, the first side member 220_1 bent along the first bending line BL1 in the first direction X, and the second side member 220_2 bent along the second bending line BL2 in the second direction Y crossing the first direction X (operation S102), perceiving the alignment marks AM of the display panel 200 that are arranged in the first corner CR1 between the first side member 220_1 and the second side member 220_2 (operation S103), determining whether the cover window 100 and the display panel 200 are aligned (operation S104), and bonding the cover window 100 and the display panel 200 (operation S105).

The display device 10 being manufactured by the method of manufacturing the display device 10 includes the display device 10 of FIGS. 1 to 12. The method of manufacturing the display device 10 is not limited to the above embodiment, and may be implemented by omitting at least one of the operations to be described hereinafter with reference to FIGS. 16 to 19 or further including one or more other operations.

Hereinafter, the method of manufacturing the display device 10 is described in detail with reference to FIGS. 16 to 19.

With reference to FIG. 16, the cover window 100 and the display panel 200 may be prepared. In an embodiment, the cover window 100 may be in the state after being bent, and the display panel 200 may be in the state before being bent. The cover window 100 may be in the state after being bent so as to have the front member 110, the first side member 120_1, the second side member 120_2, the third side member 120_3, and the fourth side member 120_4. In the state before being bent, the display panel 200 may be in the state of being unfolded flat. In some embodiments, only the display panel 200 may be first prepared. In some embodiments, the cover window 100 may be prepared at the operation of bending the display panel 200 or determining whether the cover window 100 and the display panel 200 are aligned. Although not shown in the drawings, the cover window 100 and the display panel 200 may be prepared on a movable jig or working table to be transferred.

With reference to FIG. 17, the display panel 200 may be bent before being bonded with the cover window 100. In detail, the display panel 200 may be bent along two or more bending lines crossing each other. In an embodiment, the four sides of the display panel 200 may be bent in the thickness direction. In detail, the display panel 200 may be bent to include a front member 210 which may be flat, the first side member 220_1 bent along the first bending line BL1 in the first direction X, the second side member 220_2 bent along the second bending line BL2 in the second direction Y, the third side member 220_3 bent along the third bending line BL3 in the first direction X, and the fourth side member 220_4 bent along the fourth bending line BL4 in the second direction Y.

With reference to FIGS. 1 to 7 and 18, after the display panel 200 is bent, alignment marks AM_W of the cover window 100 and/or the alignment marks AM of the display panel 200 may be perceived by at least one camera VC. The camera VC may be arranged above and/or below the display panel 200 to perceive the alignment marks AM arranged in the corners of the display panel 200. In an embodiment, the camera VC may perceive the alignment marks AM arranged in the first corner CR1 between the first and second side members 220_1 and 220_2 of the display panel 200, for example. The alignment marks AM may be easily perceived by the camera VC because of being arranged at the first corner CR1, the second corner CR2, the third corner CR3, and/or the fourth corner CR4 of the substrate SUB which is less distorted by bending of the display panel 200. In an embodiment, the corners of the substrates SUB may be the regions between the first and second side members 220_1 and 220_2, between the second and third side members 220_2 and 220_3, between the third and fourth side members 220_3 and 220_4, and between the fourth and first side members 220_4 and 220_1. In some embodiments, the corners of the substrate SUB may be regions across the first and second side members 220_1 and 220_2, across the second and third side members 220_2 and 220_3, across the third and fourth side members 220_3 and 220_4, and across the fourth and first side members 220_4 and 220_1.

Based on the perceived alignment marks AM, it may be possible to determine whether the cover window 100 and/or the display panel 200 are disposed at correct locations. In an embodiment, although not shown in the drawings, a controller or the like controlling the cameras VC may determine whether the perceived alignment marks AM of the display panel 200 match with the previously stored alignment marks AM or alignment pattern to determine whether the display panel 200 is disposed at the correct location, for example.

With reference to FIGS. 8, 9, and 18, the camera VC may perceive each of the first and second marks AM1 and AM2. In an embodiment, the camera VC may be arranged above and/or below the display panel 200, and a clearly perceived one of the first and second marks AM1 and AM2 may be selectively used to determine whether the display panel 200 is correctly aligned. This makes it possible for the display panel 200 and the cover window 100 to be more accurately bonded.

With reference to FIG. 19, when it is determined that the alignment marks AM_W of the cover window 100 and the alignment marks AM of the display panel 200 are aligned, the cover window 100 and/or the display panel 200 may be transferred to a location for bonding such that they are bonded together. In an embodiment, the display panel 200 may be at a fixed location, and the cover window 100 may be transferred to a location for bonding, but the invention is not limited thereto. In some embodiments, the cover window 100 may be at a fixed location, and the display panel 200 may be transferred to a location for bonding. In some embodiments, both the cover window 100 and the display panel 200 may be transferred to a location for bonding.

The display device and the method of manufacturing the display device according to various embodiments are advantageous in terms of facilitating perception of alignment marks.

The display device and the method of manufacturing the display device according to various embodiments are also advantageous in terms of minimizing distortion of the alignment marks.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a substrate including:
     a front member;
     first and second side members extended from the front member; and
     a first corner disposed between the first and second side members, the first side member being bent along a first bending line in a first direction, the second side member being bent along a second bending line in a second direction crossing the first direction;
   an alignment mark disposed at the first corner of the substrate; and
   a plurality of layers disposed on the substrate,
   wherein the alignment mark includes a plurality of first marks disposed on a first layer of the plurality of layers and a plurality of second marks disposed on a second layer of the plurality of layers,
   the plurality of first marks is disposed between the plurality of layers,
   the second layer is an outermost layer of the plurality of layers so that the plurality of second marks is exposed upward,
   the plurality of first marks and the plurality of second marks are arranged along a side edge of the first corner of the substrate, and
   a minimum length of a second mark among lengths of the plurality of second marks in a predetermined direction along which the plurality of first marks and the plurality of second marks are arranged is larger than a maximum length of a first mark among lengths of the plurality of first marks along the predetermined direction.

2. The display device of claim 1, wherein the substrate includes a display area and a non-display area surrounding the display area, and the alignment mark is disposed in the non-display area.

3. The display device of claim 2, wherein the non-display area is disposed across the first side member, the second side member, and the first corner of the front member disposed between the first and second side members.

4. The display device of claim 3, wherein the alignment mark is disposed in the non-display area of the first corner of the front member.

5. The display device of claim 1, wherein the alignment mark is disposed inside the first and second bending lines.

6. The display device of claim 1, wherein the alignment mark is disposed in a center area of the first corner.

7. The display device of claim 1, wherein at least one of the plurality of layers and the alignment mark include a same material.

8. The display device of claim 1, wherein the plurality of layers further include a thin film transistor layer on the substrate; a light emitting element layer on the thin film transistor layer; and an encapsulation layer on the light emitting element layer, and
   wherein the first mark is disposed on the thin film transistor layer, and the second mark is disposed on the encapsulation layer.

9. The display device of claim 8, wherein the thin film transistor layer includes an active layer; a gate insulating layer on the active layer; a gate electrode on the gate insulating layer; and a first interlayer insulating layer on the gate electrode, and
   wherein the first mark is disposed between the gate insulating layer and the first interlayer insulating layer.

10. The display device of claim 9, wherein the first mark includes a same material as a material of the gate electrode.

11. The display device of claim 8, wherein the encapsulation layer includes at least one inorganic layer, and the second mark is disposed on the at least one inorganic layer.

12. The display device of claim 8, further comprising a sensor electrode layer disposed on the encapsulation layer and including a sensing electrode,
    wherein the sensing electrode and the second mark include a same material.

13. The display device of claim 1, wherein a crack prevention hole is defined in the plurality of layers along an edge of the substrate, and the plurality of layers includes an organic layer cover covering the crack prevention hole and a dam spaced apart from the organic layer cover, and
    wherein the alignment mark is disposed between the organic layer cover and the dam.

14. The display device of claim 1, wherein the substrate further includes third and fourth side members extended from the front member, the third side member being bent along a third bending line in the first direction, the fourth side member being bent along a fourth bending line in the second direction.

15. The display device of claim 14, wherein an angle between the front member and each of the first to fourth side members ranges from about 70 degrees to about 120 degrees.

16. A display device comprising:
    a substrate including corners having a curvature, the substrate being bent along a first bending line in a first direction and a second bending line in a second direction crossing the first direction;
    alignment marks disposed at the corners of the substrate; and
    a plurality of layers disposed on the substrate,
    wherein the alignment marks includes a plurality of first marks disposed on a first layer of the plurality of layers and a plurality of second marks disposed on a second layer of the plurality of layers,
    the plurality of first marks is disposed between the plurality of layers,
    the second layer is an outermost layer of the plurality of layers so that the plurality of second marks is exposed upward,
    the plurality of first marks and the plurality of second marks are arranged along a side edge of a first corner of the substrate, and
    a minimum length of a second mark among lengths of the plurality of second marks in a predetermined direction along which the plurality of first marks and the plurality of second marks are arranged is larger than a maximum length of the first mark among lengths of the plurality of first marks along the predetermined direction.

17. A method of manufacturing a display device, the method comprising:
    preparing a cover window and a display panel including a substrate and a plurality of layers disposed on the substrate;
    bending the display panel to form a front member, a first side member bent along a first bending line in a first direction, and a second side member bent along a second bending line in a second direction crossing the first direction;
    perceiving an alignment mark of the display panel, which is disposed at a first corner between the first and second side members;
    determining whether the cover window and the display panel are aligned; and
    bonding the cover window to the display panel, wherein the alignment mark includes a plurality of first marks disposed on a first layer of the plurality of layers and a plurality of second marks disposed on a second layer of the plurality of layers, the plurality of first marks is disposed between the plurality of layers, the second layer is an outermost layer of the plurality of layers so that the plurality of second marks is exposed upward, the plurality of first marks and the plurality of second marks are arranged along a side edge of the first corner of the substrate, and a minimum length of a second mark among lengths of the plurality of second marks in a predetermined direction along which the plurality of first marks and the plurality of second marks are arranged is larger than a maximum length of a first mark among lengths of the plurality of first marks along the predetermined direction.

18. The display device of claim 1, wherein no layer is disposed on the second mark in a display panel consisting of the plurality of layers and a substrate on which the plurality of layers is disposed.

\* \* \* \* \*